United States Patent
Aoshima

Patent Number: 5,948,590
Date of Patent: Sep. 7, 1999

[54] NEGATIVE TYPE IMAGE RECORDING MATERIAL

[75] Inventor: Keitaro Aoshima, Shizuoka, Japan

[73] Assignee: Fuji Photo Film Co., Ltd., Minami-Ashigara, Japan

[21] Appl. No.: 08/901,410

[22] Filed: Jul. 28, 1997

[30] Foreign Application Priority Data

Aug. 9, 1996 [JP] Japan ................................ 8-211731

[51] Int. Cl.$^6$ .................................................. G03C 1/492
[52] U.S. Cl. ...................... 430/270.1; 430/906; 430/908; 430/926
[58] Field of Search ................................ 430/270.1, 906, 430/908, 926

[56] References Cited

U.S. PATENT DOCUMENTS

| | | | |
|---|---|---|---|
| 4,708,925 | 11/1987 | Newman | 430/270 |
| 5,340,697 | 8/1994 | Yoshimoto et al. | 430/270 |
| 5,372,907 | 12/1994 | Haley et al. | 430/157 |
| 5,449,588 | 9/1995 | Maeda et al. | 430/270 |
| 5,700,625 | 12/1997 | Sato et al. | 430/270.1 |

FOREIGN PATENT DOCUMENTS

| | | |
|---|---|---|
| 795789 | 9/1997 | European Pat. Off. . |
| 62-207309 | 9/1987 | Japan . |
| 7-20629 | 1/1995 | Japan . |

OTHER PUBLICATIONS

Derwent English abstract of JP 62–207309, Sep. 1987.

*Primary Examiner*—John A. McPherson
*Assistant Examiner*—Rosemary Ashton

*Attorney, Agent, or Firm*—Burns, Doane, Swecker & Mathis, LLP

[57] ABSTRACT

A negative type image recording material capable of processing directly from computer and other digital data, with excellent printing durability at the time of printing and lack of staining. The negative type image recording material includes (A) a polymer containing the structure represented by the following general formula (I) in the polymer side chain, (B) a compound which cross-links in the presence of acid, and (C) a compound which generates an acid in the presence of light or heat:

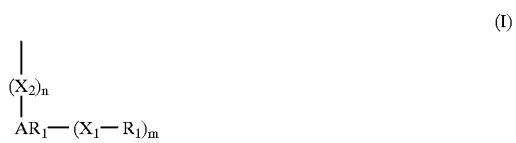

wherein, $Ar_1$ represents an arylene group having 20 or less carbon atoms which may be substituted; $X_1$ represents $NR_2$, O, S or $SiR_3R_4$; $X_2$ represents $NR_5$, O, S or $SiR_6R_7$; $R_1$ represents a hydrocarbon group having 20 or less carbon atoms which may be substituted; $R_2$, $R_3$, $R_4$, $R_5$, $R_6$ and $R_7$ may be the same or different, and each represents a hydrogen atom or a hydrocarbon atom having 20 or less carbon atoms which may be substituted; m represents an integer from 0 to 5; and n represents 1 when m is 0, and 0 or 1 when m is from 1 to 5.

17 Claims, No Drawings

NEGATIVE TYPE IMAGE RECORDING MATERIAL

BACKGROUND OF THE INVENTION

1. Field of the Invention

The present invention relates to an image recording material which can be used as a planographic printing plate. More particularly, the present invention relates to a negative type image recording material suitably used as a planographic printing plate which is capable of directly producing a printing plate using an infrared laser based on digital signals output from a computer or the like.

2. Description of the Related Art

Conventionally, as systems for producing a form plate directly from digital computer data, there have been proposed (1) a system using an electrophotographic method; (2) a system using a photopolymerizable compound, which polymerizes upon being exposed to a laser which emits blue or green light; (3) a system using a recording material in which a salt is laminated on a photosensitive resin; and (4) a system using a silver salt diffusion transfer method.

However, the system using an electrophotographic method (1) above has complicated image formation processes such as charging, exposure, developing, and the like and therefore the apparatus thereof becomes sophisticated and large. In a system using a photopolymerizable compound (2) above, since a form plate which is highly sensitive to blue or green light is used, it is difficult to handle in an illuminated room. In methods (3) and (4), since a silver salt is used, there are the disadvantages that processes such as developing and the like become complicated and the waste solution naturally contains silver.

In recent years, laser technologies have developed remarkably. In particular, high output and compact solid-state lasers and semiconductor lasers emitting infrared rays of a wavelength of 760 nm to 1,200 nm are readily available. These lasers are very useful as a light source for recording in the direct production of a form plate from digital computer data. However, since most practical useful photosensitive recording materials are sensitive to visible light having a wavelength of 760 nm or less, image recording cannot be carried out with these infrared lasers. Therefore, a material recordable with an infrared laser is desired.

As an example of the image recording materials capable of recording images by the use of an infrared ray laser, a recording material comprising an onium salt, a phenol resin and a spectral sensitizing agent is disclosed in U.S. Pat. No. 4,708,925. However, the image recording material is a positive type recording material utilizing the dissolution prevention effect, generated by the onium salt and the phenol resin, with respect to the developer. On the other hand, examples of negative type image recording materials include a recording material comprising an onium salt, a resol resin, a novolak resin, and an infrared ray absorbing agent disclosed in Japanese Patent Application Laid-Open (JP-A) No. 7-20629. According to the image recording material, a positive image is obtained only with laser exposure, but by conducting a heat treatment after the laser exposure, a negative image can be obtained. In general, in order to obtain a negative image, a coated film should not remain on unexposed portions, non-image formation portions, after developing. When the image recording material disclosed in Japanese Patent Application Laid-Open (JP-A) No. 7-20629 is heat treated after exposure under mild conditions, positive type characteristics of the recording material become difficult to eliminate and a coated film tends to remain on the unexposed portions. Accordingly, a printing plate utilizing this type of image recording material suffers from the problem of staining at the time of printing. Furthermore, the printing plate using this type of image recording material lacks film strength in the image portion and consequently printing durability at the time of printing is insufficient.

SUMMARY OF THE INVENTION

Accordingly, one object of the present invention is to provide a negative type image recording material capable of directly producing a printing plate from computer digital signals through infrared irradiating solid state or semiconductor lasers. Another object of the present invention is to provide a negative type image recording material which has little residual coated film on the non-image portion after recording an image, and can thus prevent generation of stains at the time of printing. Yet another object of the present invention is to provide a negative type image recording material with excellent recorded image film strength and thus good printing durability at the time of printing.

The inventor of the present invention paid attention to the constituents of the negative type image recording materials and after a great deal of research and discussion, found that the above-mentioned objects can be achieved in the present invention through the use of a polymer having a substituent where a hetero atom is directly bonded with an aromatic ring as the binder. That is, the present invention comprises: (A) a polymer including the structure represented by the following general formula (I) in the polymer side chain; (B) a compound which cross-links in the presence of acid (hereinafter referred to as "heat cross-linking agent"); and (C) a compound generating an acid in the presence of light or heat (hereinafter referred to as "acid generating agent").

(I)

wherein $Ar_1$ represents an arylene group having 20 or less carbon atoms which may be substituted; $X_1$ represents $NR_2$, O, S or $SiR_3R_4$; $X_2$ represents $NR_5$, O, S, or $SiR_6R_7$; $R_1$ represents a hydrocarbon group having 20 or less carbon atoms which may be substituted; $R_2$, $R_3$, $R_4$, $R_5$, $R_6$, and $R_7$ may be the same or different, and each represents a hydrogen atom or a hydrocarbon atom having 20 or less carbon atoms which may be substituted; and m represents an integer from 0 to 5; n represents 1 when m is 0 and n represents 0 or 1 when m is from 1 to 5.

DETAILED DESCRIPTION OF THE PREFERRED EMBODIMENTS

The present invention will now be explained in detail.
(A) polymer including the structure represented by the general formula (I) in the polymer side chain In the present invention, a polymer containing the structure represented by the above-mentioned general formula (I) in the polymer side chain is used. The structure represented by the general formula (I) can be directly bonded to the polymer principal chain or bonded to the polymer principal chain via an appropriate linking chain in a pendant-like manner. Examples of preferable linking chains include an ester bond, an amide bond, an ether bond, and a hydrocarbon group having 20 or less carbon atoms which may have the above-mentioned bonds. Examples of polymer principal chains include vinyl polymers, which are a principal chain of poly(meth)acrylate, polystyrene, or polyvinyl acetal; polyester; and polyurethane. Among these examples, vinyl polymers are preferable with respect to availability and economy.

In the general formula (I), $Ar_1$ represents an arylene group having 20 or less carbon atoms which may be substituted. Concrete examples of arylene groups include phenylene, naphthylene, anthracenylene, and phenanthrenylene. Among these examples, phenylene and naphthylene are preferable with respect to availability and economy. Examples of preferable substituents, which these arylene groups may have, include a hydrocarbon group having 20 or less carbon atoms, a halogen atom, a cyano group, a nitro group, a carboxyl group, and a carbamoyl group.

$R_1$ represents a hydrocarbon group having 20 or less carbon atoms which may be substituted. $X_1$ represents $NR_2$, O, S or $SiR_3R_4$. $X_2$ represents $NR_5$, O, S or $SiR_6R_7$. $R_2$, $R_3$, $R_4$, $R_5$, $R_6$ and $R_7$ may be the same or different, and each represents a hydrogen atom or a hydrocarbon atom having 20 or less carbon atoms which may be substituted. Examples of preferable substituents used in $R_1$ to $R_7$ include a halogen atom, a cyano group, a nitro group, a carboxyl group, a carbamoyl group, an alkoxyl group having 20 or less carbon atoms, a perfluoroalkyl group having 20 or less carbon atoms and a hydroxyalkyl group having 20 or less carbon atoms.

m represents an integer from 0 to 5. n represents 1 when m is 0, and represents 0 or 1 when m is from 1 to 5. That is, at least one of $X_1$ and $X_2$ must be bonded to $Ar_1$. Preferably at least two of $X_1$ and $X_2$ are bonded to $Ar_1$.

Polymers having a structure represented by the general formula (I) in the polymer side chains preferably used in the present invention include structural units represented by the following general formulas (II) or (III). Constituents in the general formulas (II) and (III) that are the same as those in the general formula (I) have the same numerals and further explanation is not provided herein.

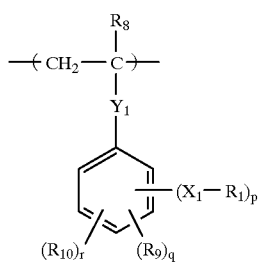

(II)

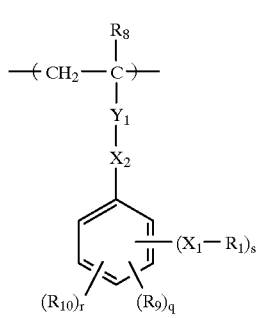

(III)

wherein $Y_1$ represents a single bond, an ester bond, an amide bond, an ether bond, and a hydrocarbon group having 20 or less carbon atoms which may have the above-mentioned bonds; $R_8$ represents a hydrogen atom or a methyl group; and $R_9$ and $R_{10}$ may be the same or different, and each represents a hydrogen atom, a halogen atom, or a hydrocarbon group having 20 or less carbon atoms which may be substituted. Examples of preferable substituents, which $R_9$ and $R_{10}$ may have, include a halogen atom, a cyano group, a nitro group, a carboxyl group, carbamoyl group an alkoxyl group having 20 or less carbon atoms, a perfluoloalkyl group, and a hydroxyalkyl group. $R_9$ and $R_{10}$ may form a condensed benzene ring, a naphthalene ring or a cyclohexane ring. p represents an integer of 1 to 4. q and r both represent an integer of 0 to 3. s represents an integer of 0 to 4.

These polymers can be obtained by radical polymerization with a monomer corresponding to the general formula (IV) or (V) in a conventionally-known method. Constituents in the general formulas (IV) and (V) are the same as those in the general formulas (I), (II), and (III) and have the same numerals and further explanation is not provided herein.

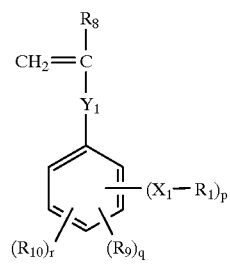

(IV)

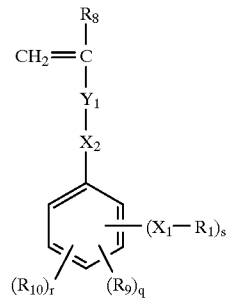

(V)

Among monomers represented by the general formulas (IV) and (V), those preferably used in the present invention are presented below.

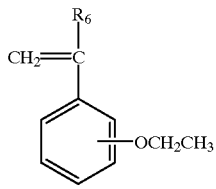

(IV-1)

(o-, m-, p-)

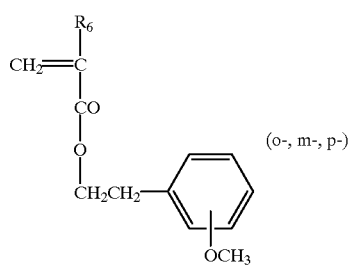 (IV-2) (o-, m-, p-)
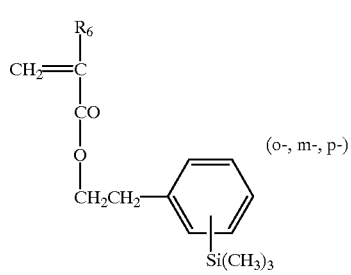 (IV-3) (o-, m-, p-)
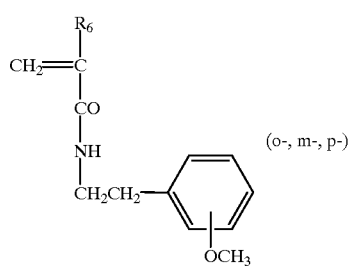 (IV-4) (o-, m-, p-)
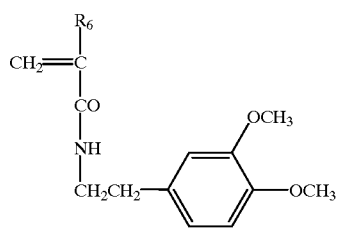 (IV-5)
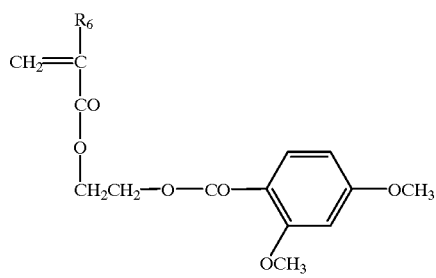 (IV-6)
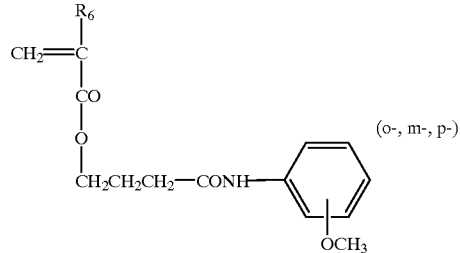 (IV-7) (o-, m-, p-)
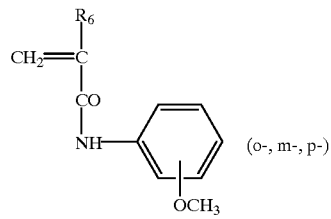 (IV-8) (o-, m-, p-)
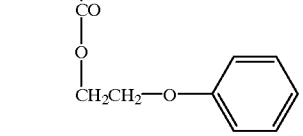 (V-1)
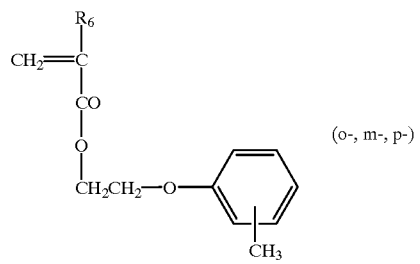 (V-2) (o-, m-, p-)
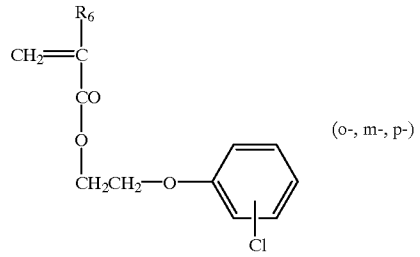 (V-3) (o-, m-, p-)
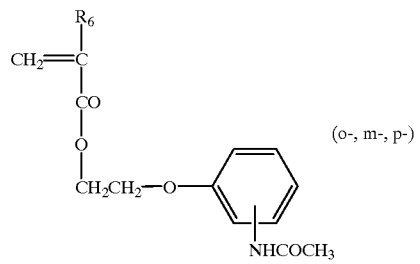 (V-4) (o-, m-, p-)

(V-5) (o-, m-, p-)
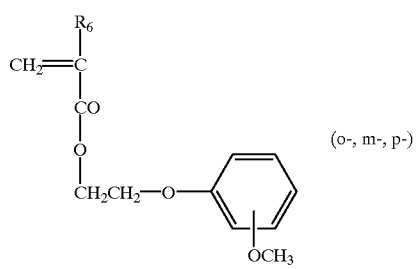
(V-6) (o-, m-, p-)
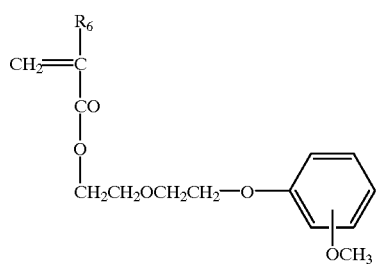
(V-7) (o-, m-, p-)
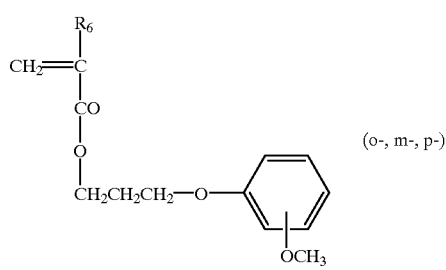
(V-8) (o-, m-, p-)
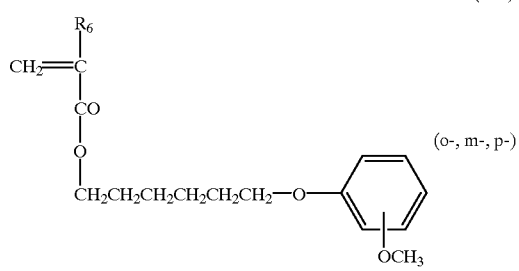
(V-9)
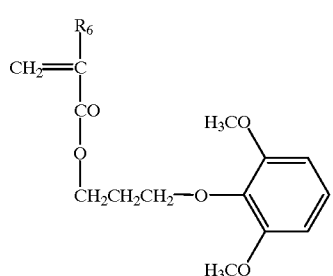
(V-10) (o-, m-, p-)
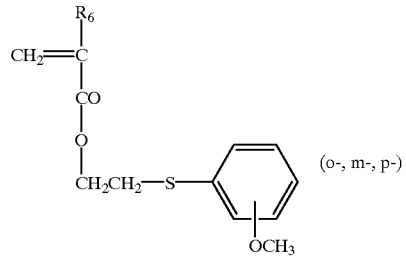
(V-11)
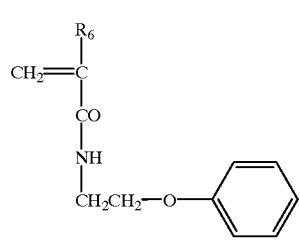
(V-12)
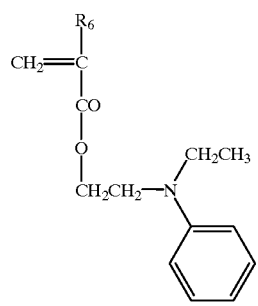
(V-13) (o-, m-, p-)
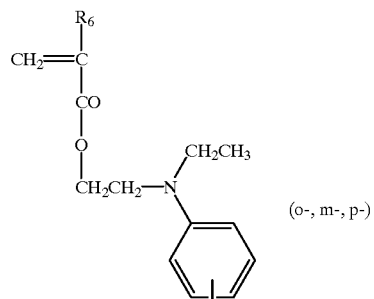
(V-14) (o-, m-, p-)
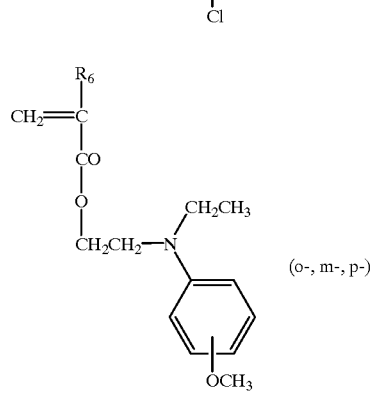

-continued

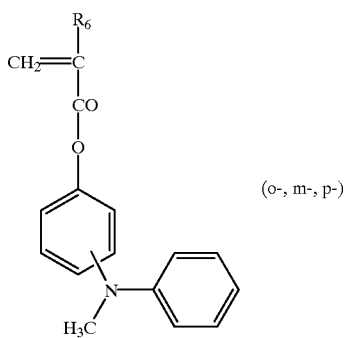
(V-15)
(o-, m-, p-)

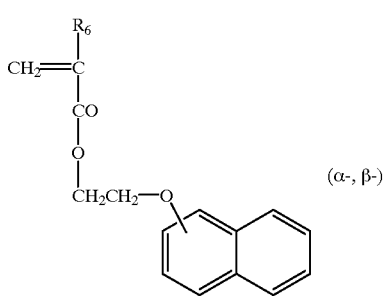
(V-16)
(α-, β-)

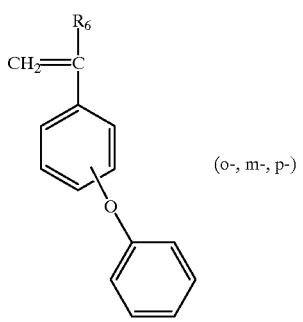
(V-17)
(o-, m-, p-)

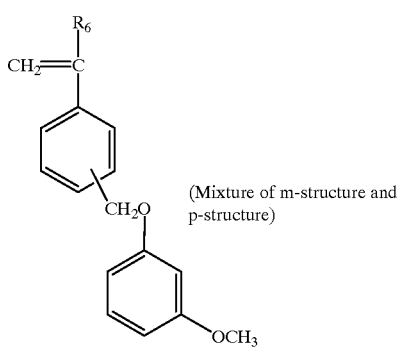
(V-18)
(Mixture of m-structure and p-structure)

In the structural formulas (IV-1) to (IV-8) and (V-1) to (V-18), $R_4$ represents a hydrogen atom or a methyl group.

In the present invention, it is preferable to use a polymer obtained by the radical polymerization of at least one of the monomers represented by the general formulas (IV) and (V). Both a homopolymer obtained with only one kind from the monomers represented by the general formulas (IV) to (V) and a copolymer obtained with two or more kinds can be used.

In the present invention, polymers further preferably used are copolymers obtained by the radical polymerization of at least any one of the monomers represented by the general formulas (IV) and (V), and a monomer having an acid group such as carboxylic acid. It is preferable to introduce an acid group in a polymer with respect to the improvement of developing property with water or an alkaline aqueous solution. Examples of acid groups include —COOH, —CONHCO—, —CONHSO$_2$—, —SO$_2$NH—, and phenolic OH.

Examples of monomers having such an acid group include acrylic acid, methacrylic acid, itaconic acid, maleic acid, N-(2-carboxy ethyl) acrylamide, N-(2-carboxy ethyl) methacryl amide, N-(carboxy phenyl) acrylamide, N-(carboxy phenyl) methacrylamide, carboxy styrene, maleimide, N-(phenyl sulfonyl) acrylamide, N-(phenyl sulfonyl) methacrylamide, N-(tolyl sulfonyl) acrylamide, N-(tolyl sulfonyl) methacrylamide, N-(chlorophenyl sulfonyl) acrylamide, N-(chlorophenyl sulfonyl) methacrylamide, N-(sulfamoyl phenyl) acrylamide, N-(sulfamoyl phenyl) methacrylamide, N-(methyl sulfamoyl phenyl) acrylamide, N-(methyl sulfamoyl phenyl) methacrylamide, N-(phenyl sulfamoyl phenyl) acrylamide, N-(phenyl sulfamoyl phenyl) methacrylamide, N-(tolyl sulfamoyl phenyl) acrylamide, N-(tolyl sulfamoyl phenyl) methacrylamide, N-[(chlorophenyl sulfamoyl) phenyl] acrylamide, N-[(chlorophenyl sulfamoyl) phenyl] methacrylamide, N-(hydroxy phenyl) acrylamide, N-(hydroxy phenyl) methacrylamide, N-(hydroxy naphthyl) acrylamide, and N-(hydroxy naphthyl) methacrylamide.

In addition to acid groups, monomers containing a salt of a strong acid such as a sodium salt of p-styrene sulfonic acid, an alkaline metal salt of 2-acrylamide-2-methyl propane sulfonic acid, a tetraalkyl ammonium salt, a potassium salt of 3-sulfopropyl acrylate are also preferably used as a constituent of a copolymer since they can improve dissolving properties in water and consequently improve the developing properties of the image recording material in water based developers.

Furthermore, in addition to the monomers having an acid group and the monomers containing a salt, conventionally-known monomers can be used if needed. Examples of such known monomers include acrylates such as methyl acrylate, ethyl acrylate, propyl acrylate, butyl acrylate, 2-ethylhexyl acrylate, cyclohexyl acrylate, 2-hydroxyethyl acrylate, benzyl acrylate; methacylates such as methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate; and acrylonitrile.

The proportion of constituent unit represented by the general formula (II) or (III) contained in the copolymer using the above-mentioned monomers is preferably 20 to 95% by weight, more preferably 30 to 90% by weight.

The weight-average molecular weight of the polymer used in the present invention is preferably 5,000 or more, and more preferably from 10,000 to 300,000. The number-average molecular weight is preferably 1,000 or more, and more preferably from 2,000 to 250,000. A polydispersion degree (weight-average molecular weight/number-average molecular weight) is preferably 1 or more, and more preferably from 1.1 to 10.

These polymers can be random polymers, block polymers, or graft polymers, but random polymers are preferable.

Examples of solvents used in the synthesis of the polymer used in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formaldehyde, N,N-dimethyl acetamide, toluene, ethyl acetate, methyl lactate, ethyl lactate, dimethyl sulfoxide and water. These solvents can be used alone or as a mixture of two or more.

As a radical polymerization initiator used in the synthesis of a polymer used in the present invention, known compounds such as an azo type initiator and a peroxide initiator can be used.

The amount of the radical polymerization initiator is, with respect to the total solid component of the image recording material, preferably at 40 to 90% by weight. If the addition amount is less than 20% by weight, the hardness of the image portion after image formation is insufficient. If the addition amount is more than 95% by weight, an image cannot be formed.

(B) Heat cross-linking agent

A heat cross-linking agent preferably used in the present invention (hereinafter referred to as a cross-linking agent) is compound having, in a molecule, at least two groups, such as a hydroxymethyl group, alkoxymethyl group, epoxy group, and vinyl ether group. A heat cross-linking agent is preferably a compound in which these cross-linkable groups are directly bonded to an aromatic ring. Examples thereof include methylol melamine, resol resin, epoxidized novolak resin, and urea resin. Furthermore, compounds disclosed in "Kakyozai Handbook (Cross-linking Agent Handbook)", by Shinzo Yamashita and Tosuke Kaneko, published by Taiseisha, Co., Ltd., are also preferable. In particular, phenol derivatives having, in a molecule, at least two groups such as a hydroxymethyl group and alkoxymethyl group provide good fastness in an image portion when an image is formed, and thus are preferable. Examples of phenol derivatives include resol resin.

However, these cross-linking agents are unstable with respect to heat, and thus they are not very favorable in terms of storability after the production of an image recording material. On the other hand, phenol derivatives having, in a molecule, at least two groups such as a hydroxymethyl group and alkoxymethyl group, and 3 to 5 benzene rings with a molecular weight of 1,200 or less have good storability, and thus are most preferably used in the present invention.

As an alkoxymethyl group, those having 6 or fewer carbon atoms are preferable. Examples thereof include a methoxymethyl group, ethoxymethyl group, n-propoxymethyl group, isopropoxymethyl group, n-butoxymethyl group, isobutoxymethyl group, sec-butoxymethyl group, and t-butoxymethyl group. Furthermore, alkoxymethyl groups having an alkoxy substituent or alkoxy substituents such as a 2-methoxyethoxymethyl group, and 2-methoxy-1-propoxymethyl group are also preferable.

Among these phenol derivatives, particularly preferable ones are shown below.

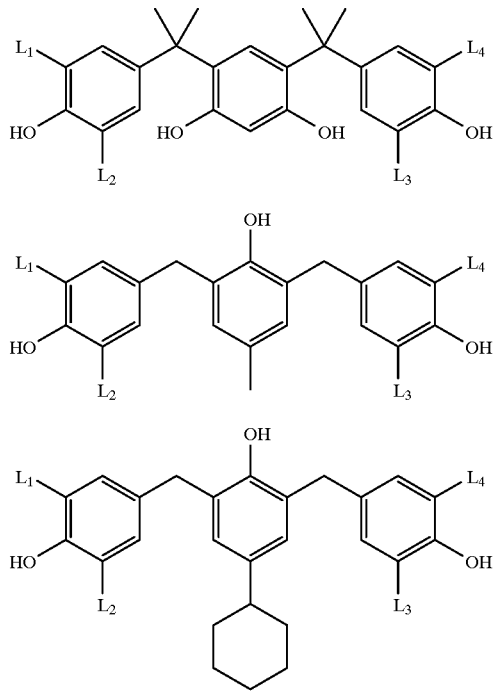

-continued
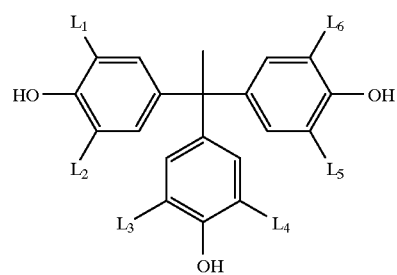
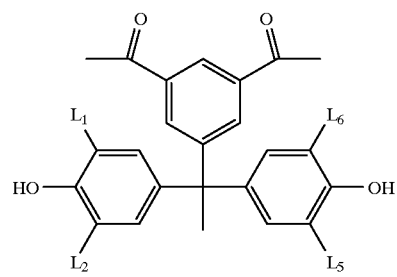
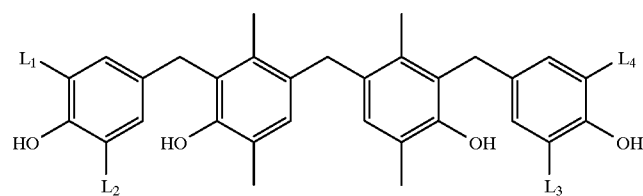
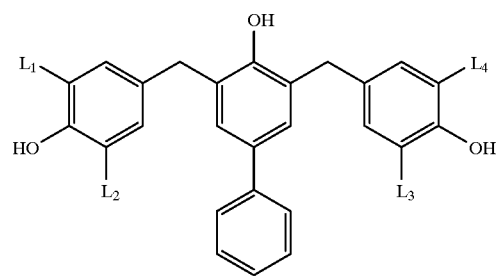
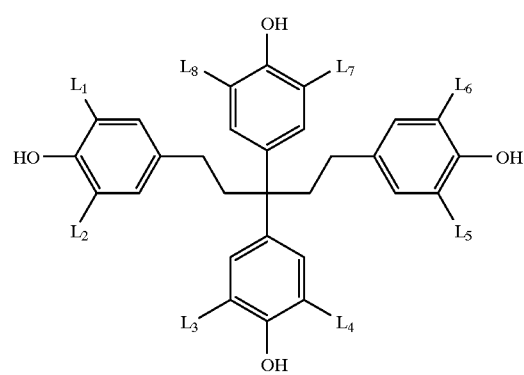

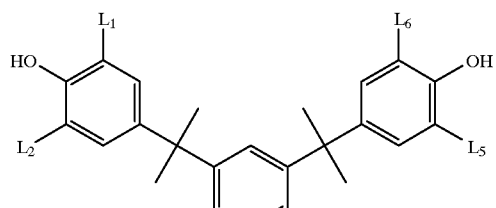
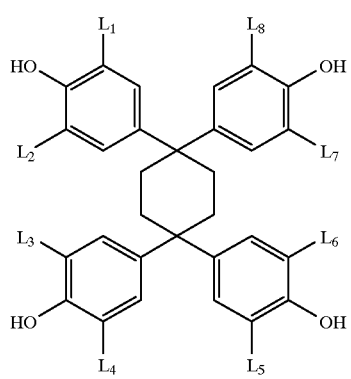
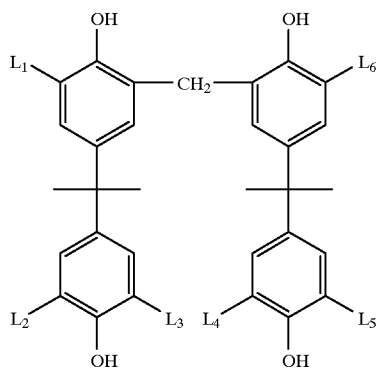
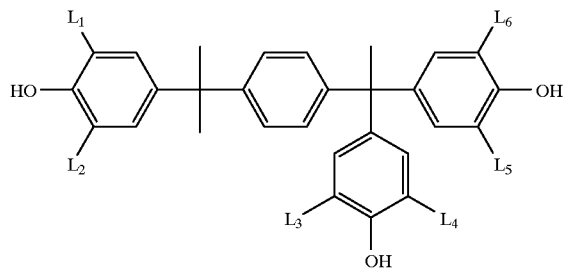

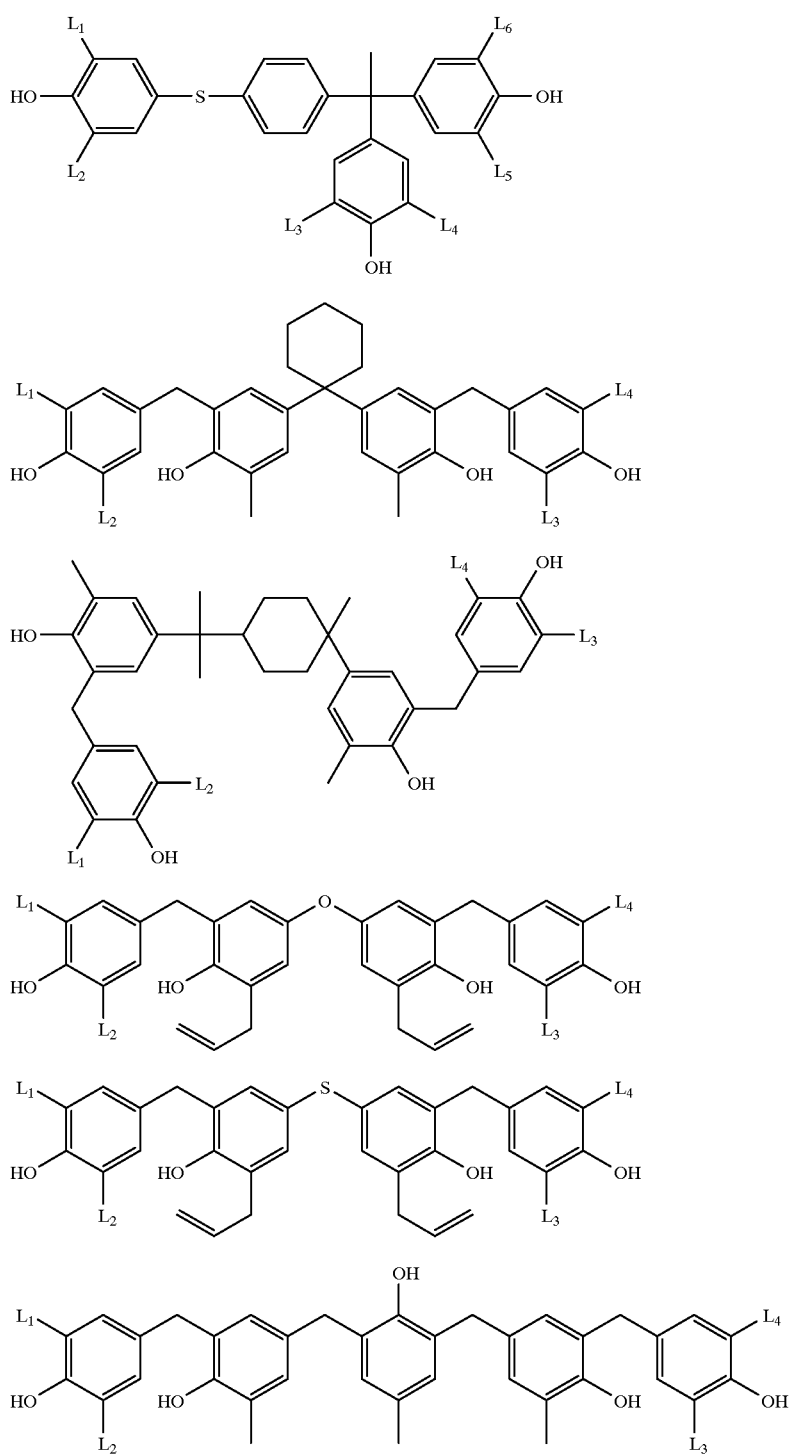

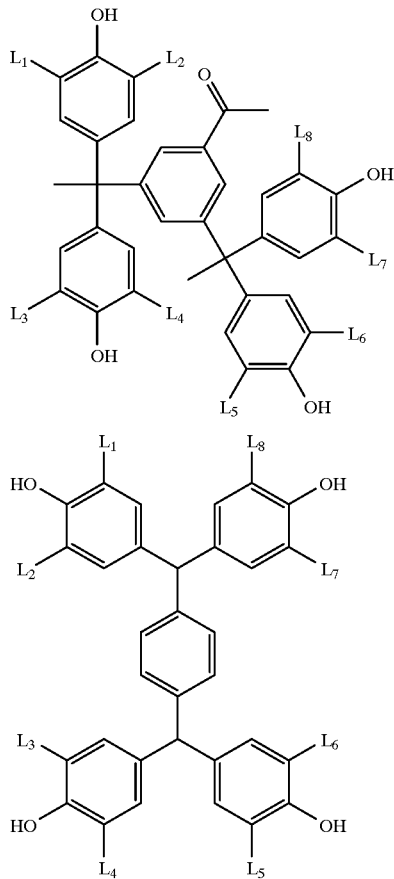

wherein $L^1$ to $L^8$ may be the same or different, and each represents a hydroxymethyl group, methoxymethyl group, or ethoxymethyl group.

Phenol derivatives having a hydroxymethyl group can be obtained by the reaction of a corresponding phenol compound without a hydroxymethyl group (a compound wherein $L^1$ to $L^8$ are hydrogen atoms in the above formulas) and formaldehyde in the presence of a base catalyst. At the time, it is preferable that a reaction temperature be 60° C. or less so as to prevent resinification or gelation of the phenol derivative. Specifically, the phenol derivatives having a hydroxymethyl group can be synthesized by methods disclosed in Japanese Patent Application Laid-Open (JP-A) Nos. 6-282067 and 7-64285.

Phenol derivatives having an alkoxymethyl group can be obtained by the reaction of a corresponding phenol derivative having a hydroxymethyl group and alcohol in the presence of an acid catalyst. At the time, it is preferable that a reaction temperature be 100° C. or less so as to prevent resinification or gelation of the phenol derivative. Specifically, the phenol derivatives having an alkoxymethyl can be synthesized by a method disclosed in European Patent (EP) No. 632,003A1.

The phenol derivatives having a hydroxymethyl group or an alkoxymethyl group synthesized as mentioned above are preferable in terms of storability. The phenol derivatives having an alkoxymethyl group are particularly preferably in terms of storability.

In the present invention, a cross-linking agent is used in the amount of 5 to 70% by weight, and preferably 10 to 65% by weight based on the total solid component of the image recording material. In a case in which the amount of the cross-linking agent is less than 5% by weight, the film strength of the image portion at the time of image recording deteriorates. On the other hand, an amount more than 70% by weight is not preferable in terms of storability.

These cross-linking agents can be used alone or in a combination of two or more.

(C) Acid generating agent

An acid generating agent in the present invention denotes a compound which decomposes and generates acid when exposed to light or heat of 100° C. or more. It is preferable that the acid generated is a strong acid having a pKa of 2 or less such as sulfonic acid and hydrochloric acid. Examples of acid generating agents preferably used in the present invention include onium salts such as an iodonium salt, a sulfonium salt, a phosphonium salt, and a diazonium salt. Specifically, compounds disclosed in U.S. Pat. No. 4,708,925 and Japanese Patent Application Laid-Open (JP-A) No. 7-20629 can be used. In particular, iodonium salts, sulfonium salts, and diazonium salts, having sulfonic acid ions as the counter ions are preferable. Furthermore, benzyl sulfonates, as disclosed in U.S. Pat. Nos. 5,135,838 and 5,200,544, are also preferable. Moreover, active sulfonic esters and disulfonyl compounds disclosed in Japanese Patent Application Laid-Open (JP-A) Nos. 2-100054 and 2-100055, and Japanese Patent Application No. 8-9444 are also preferable. Besides, haloalkylated S-triazines disclosed in Japanese Patent Application Laid-Open (JP-A) No. 7-271029 are also preferable.

Particularly preferable acid generating agents used in the present invention are compounds represented by the following general formula (VI) or (VII).

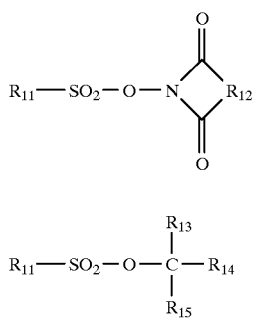

(VI)

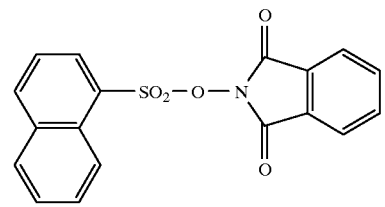

(VII)

wherein $R_{11}$ represents a hydrocarbon group having 30 or less carbon atoms which may be substituted; $R_{12}$ represents a divalent hydrocarbon group having 25 or less carbon atoms which may be substituted; $R_{13}$, $R_{14}$, and $R_{15}$ may be the same or different, and each represents a hydrogen atom or a hydrocarbon group having 20 or less carbon atoms which may be substituted. Further, two or more of $R_{13}$, $R_{14}$, and $R_{15}$ may be bonded to each other to form a ring. Examples of substituents preferably used in $R_{11}$, $R_{12}$, $R_{13}$, $R_{14}$, and $R_{15}$ include a halogen atom, a nitro group, a cyano group, a carboxyl group, a carbamoyl group, an oxo group, a hydroxyl group, an alkyloxy group having 20 or less carbon atoms, and an aryloxy group having 20 or less carbon atoms.

Examples of particularly preferred compounds represented by the general formula (VI) or (VII) are shown below.

These compounds can be synthesized by the methods disclosed in Japanese Patent Application Laid-Open (JP-A) Nos. 2-100054 and 2-100055, U.S. Pat. Nos. 5,135,838 and 5,200,544.

(VI-1)

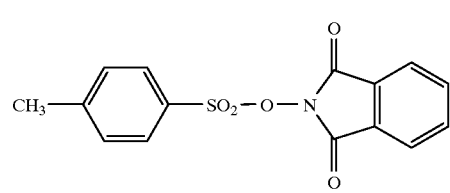

(VI-2)

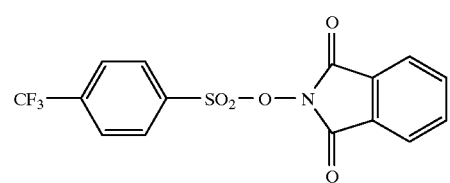

(VI-3)

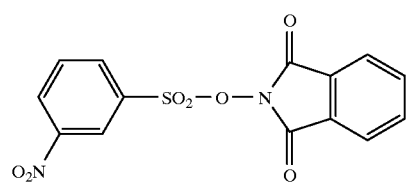

(VI-4)

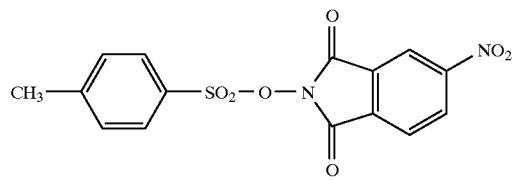

(VI-5)

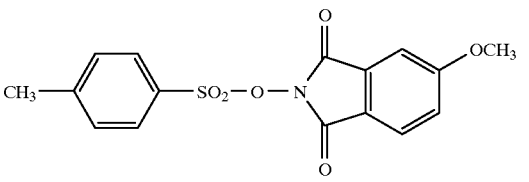

(VI-6)

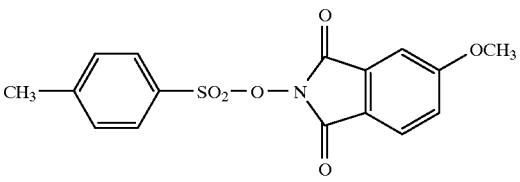

(VI-7)

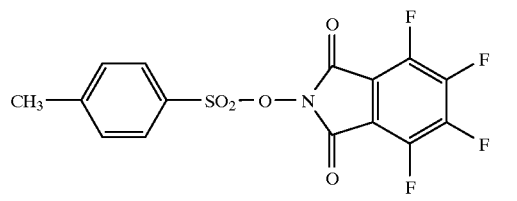

(VI-8)

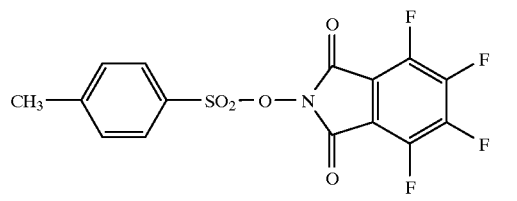

(VI-9)

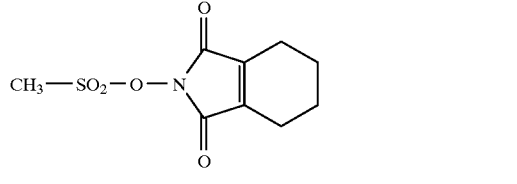

(VI-10)

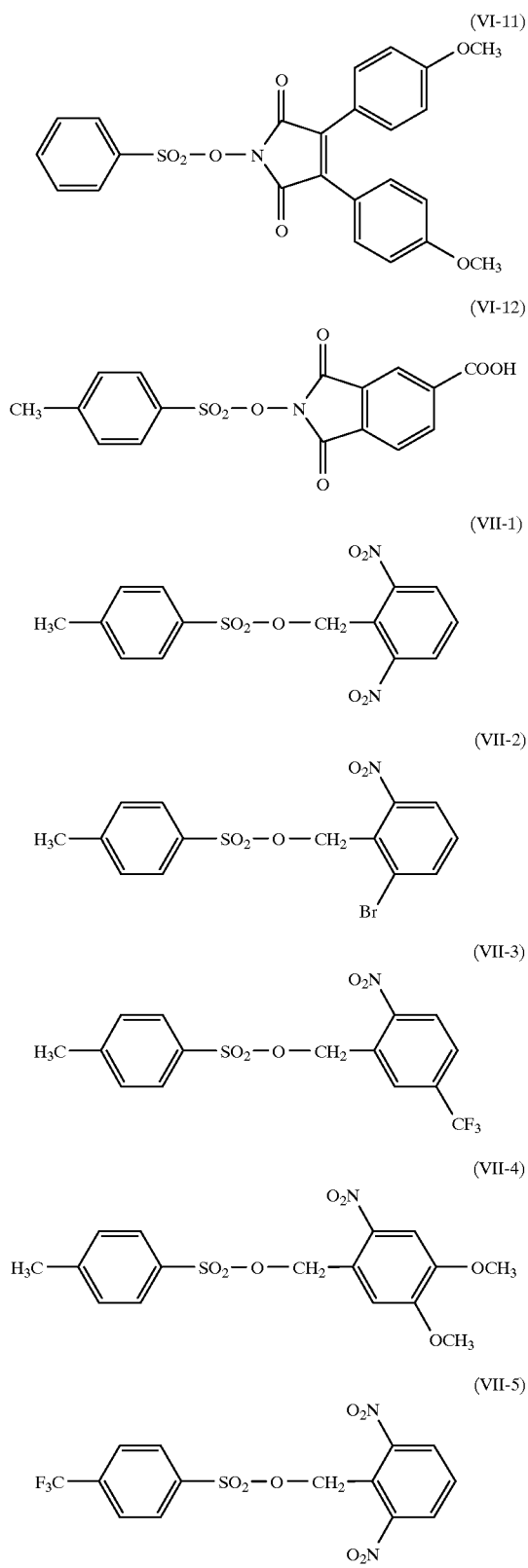
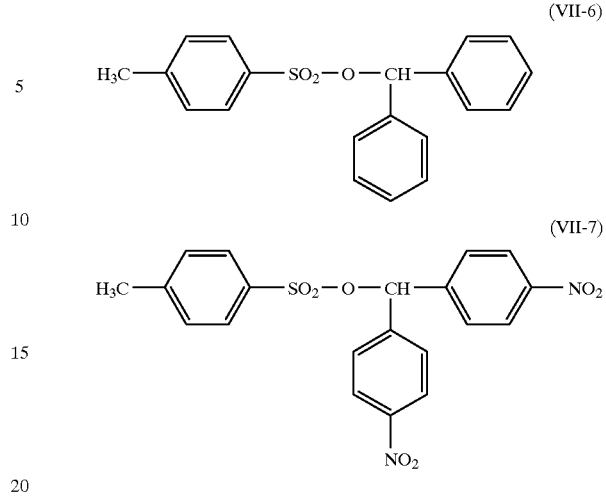

These compounds are added at a proportion of 0.01 to 50% by weight of the total solid component of the image recording material, preferably at 0.1 to 25% by weight, and more preferably 0.5 to 15% by weight. If the amount of additive is less than 0.01% by weight, an image cannot be obtained. If the amount of additive is more than 50% by weight, staining occurs on the non-image portion at the time of printing.

These compounds can be used alone or in a combination of two or more types.

Spectral sensitizing agent

In the present invention, the above-mentioned acid generating agents decompose and generate acid when exposed to light or heat. When using acid generating agents which decompose when exposed to light, it is not necessary to use a spectral sensitizing agent when irradiating light absorbed by the acid generating agent (such as ultraviolet light). However, when light not absorbed by the acid generating agent is irradiated, a spectral sensitizing agent is necessary. Sensitizing agents like known sensitizing agents conventionally used in light radical polymerization type image recording materials can be used when visible light is irradiated. Specific examples include the eosins disclosed in Japanese Patent Application Laid-Open (JP-A) No. 4-219756 and the pigments having a thiazolidinone skeleton disclosed in Japanese Patent Application Laid-Open (JP-A) Nos. 2-244050 and 8-220757. However, image recording materials of the present invention do not contain a radically polymerizable polyfunctional monomer. Therefore, it is not known clearly whether or not a sensitizing agent effectively used in the above-mentioned light radical polymerization type can be also effectively used in the present invention.

One of the main purposes of the present invention is to record an image with an infrared ray generating laser. For this reason, both the above-described spectral sensitizing agent and an infrared ray absorbing agent need to be used as spectral sensitizing agents.

Infrared ray absorbing agents used in the present invention are a dye or pigment effectively absorbing an infrared ray having a wavelength of 760 nm to 1,200 nm. It is preferable that the dye or pigment have an absorption maximum between the wavelengths of 760 nm and 1,200 nm.

As dyes, known dyes commercially available or those disclosed in the literature (such as "Senryo Binran (Dye Handbook)" edited by Yuki Gosei Kagaku Kyokai (Organic Synthetic Chemistry Association), published in 1970, can be used. Specifically, examples include azo dyes, metal complex azo dyes, pyrazolone azo dyes, naphthoquinone dyes, anthraquinone dyes, phthalocyanine dyes, carbonium dyes, quinoneimine dyes, methyne dyes, cyanine dyes, squalilium dyes, pyrylium salts and metal thiolate complexes.

Examples of preferable dyes include cyanine dyes disclosed in Japanese Patent Application Laid-Open (JP-A) Nos. 58-125246, 59-84356, 59-202829, and 60-78787; methyne dyes disclosed in Japanese Patent Application Laid-Open (JP-A) Nos. 58-173696, 58-181690, and 58-194595; naphthoquinone dyes disclosed in Japanese Patent Application Laid-Open (JP-A) Nos. 58-112793, 58-224793, 59-48187, 59-73996, 60-52940, and 60-63744; squalilium dyes disclosed in Japanese Patent Application Laid-Open (JP-A) No. 58-112792; and cyanine dyes disclosed in U. K. Patent No. 434,875.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethyne thiapyrylium salts disclosed in Japanese Patent Application Laid-Open (JP-A) No. 57-142645 (U.S. Pat. No. 4,327,169); pyrylium-containing compounds disclosed in Japanese Patent Application Laid-Open (JP-A) Nos. 58-181051, 58-220143, 59-41363, 59-84248, 59-84249, 59-146063, and 146061; cyanine dyes disclosed in Japanese Patent Application Laid-Open (JP-A) No. 59-216146; pentamethyne thiopyrylium salts disclosed in U.S. Pat. No. 4,283,475; and pyrylium compounds disclosed in Japanese Patent Application Publication Nos. 5-13514 and 5-19702 can be preferably used as well.

As other examples of preferable dyes, near infrared absorption dyes disclosed U.S. Pat. No. 4,756,993 represented by formulas (I) and (II) can be presented.

Among these dyes, particularly preferable are cyanine dyes, squalilium dyes, pyrylium salts, and nickel thiolate complexes.

Pigments usable in the present invention include commercially available pigments and those disclosed in the Color Index (C. I.) Manual, "Saishin Ganryo Binran (Modern Pigment Manual)" edited by Nippon Ganryo Gijutsu Kyokai (Japan Pigment Technology Association), published in 1977; "Saishin Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after being applied with surface treatment. Examples of surface treatment methods include a method of surface coating with a resin or a wax, a method of adhering a surfactant, and a method of bonding a reactive substance (such as a silane coupling agent, an epoxy compound, and polyisocyanate) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press; published in 1984; and "Saishin Ganryo Oyo Gijutsu (Modern Pigment Application Technology)" by CMC Press, published in 1986.

A pigment particle size of 0.01 $\mu$m to 10 $\mu$m is preferable, 0.05 $\mu$m to 1 $\mu$m is more preferable, and 0.1 $\mu$m to 1 $\mu$m is the most preferable. A pigment particle size smaller than 0.01 $\mu$m is not preferable in terms of the stability of the pigment dispersion in a photosensitive layer coating solution. On the other hand, a pigment particle size larger than 10 $\mu$m is not preferable in terms of the uniformity of the image recording layer.

As methods of dispersing a pigment, known dispersing methods employed in ink production or toner production can be used. Examples of dispersing machines include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

These dyes or pigments can be added in an amount of 0.01 to 50% by weight based on the total solid component of the image recording material, preferably in an amount of 0.1 to 10% by weight, more preferably in an amount of 0.5 to 10% by weight in the case of a dye, and more preferably in an amount of 1.0 to 10% by weight in the case of a pigment. An amount of a pigment or dye less than 0.01% by weight causes low sensitivity. On the other hand, an amount more than 50% by weight produces stains in a nonimage portion at the time of printing.

These dyes or pigments can be added in a layer with other components or, in a case in which the image recording material comprises a plurality of layers, can be added in a layer which is different from a layer containing the other components.

In general, in the case of a visible light sensitizing agent, the functional mechanism is considered to be due to energy transfer or electron transfer as disclosed in "Zokanzai (sensitizing agents)" by Katsumi Tokumaru and Shin Ogawara, published by Kodansha Co., Ltd. However, the functional mechanism of infrared ray sensitizing agents has not yet been fully elucidated. However, it has been suggested that infrared ray absorbing agents generate heat and thermally decompose acid generating agents upon absorption of infrared light.

Other components

In the present invention, the above-mentioned four components (A) to (D) are necessary, and various compounds can be added to the image recording material as needed.

For example, a dye having a large absorption in the visible light region can be used as the coloring agent.

Specifically, examples include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes disclosed in Japanese Patent Application Laid-Open (JP-A) No. 62-293247.

It is preferable to add these dyes for easily distinguishing the image portion and the nonimage portion after image formation. The amount to be added is 0.01 to 10% by weight based on the total solid component of the image recording material.

In order to enable stable treatment regardless of the fluctuation in development conditions, a nonionic surfactant disclosed in Japanese Patent Application Laid-Open (JP-A) Nos. 62-251740 and 3-208514 and an ampholytic surfactant disclosed in Japanese Patent Application Laid-Open (JP-A) Nos. 59-121044 and 4-13149 can be added to an image recording material of the present invention.

Examples of nonionic surfactants include sorbitan tristearate, sorbitan monopalmitate, sorbitan triolate, mono glyceride stearate, and polyoxyethylene nonylphenyl ether.

Examples of ampholytic surfactants include alkyl di(aminoethyl)glycine, alkyl polyaminoethylglycine hydrochloride, 2-alkyl-n-carboxyethyl-N-hydroxyethyl imidazolinium betaine, and N-tetradecyl-N,N-substituted betaine (for example, Amorgen K manufactured by Dai-Ichi Kogyo Co., Ltd.).

The amount of the above-mentioned nonionic surfactants and ampholytic surfactants is preferably 0.05 to 15% by weight, and more preferably 0.1 to 5% by weight in an image recording material.

In order to provide flexibility to the film, etc., a plasticizer can be added as needed to the image recording material of the present invention. Examples of a plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

An image recording material of the present invention can be produced, in general, by dissolving the above-mentioned component in a solvent and applying the resultant solution to an appropriate support. Solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrolidone, dimethyl sulfoxide, sulfolane, γ-butyl lactone, toluene, and water.

These solvents are used alone or as a mixture. The concentration of the above-mentioned components (total solid components including additives) is preferably 1 to 50% by weight in the solution. The application amount (solid component) on the support obtained after applying and drying is determined according to the application purpose. However, as to the planographic printing plate, in general, 0.5 to 5.0 g/m$^2$ is preferable. As a method of application, various methods can be used, such as bar coater application, rotation application, spray application, curtain application, dip application, air knife application, blade application, and roll application. As the application amount decreases, the apparent sensitivity increases, but the film characteristic of the image recording film decreases.

A surfactant for improving the applicability, such as a fluorine-containing surfactant disclosed in Japanese Patent Application Laid-Open (JP-A) No. 62-170950 can be added to an image recording layer of the present invention. An addition amount is preferably 0.01 to 1% by weight based on the total solid component of the image recording material, and more preferably 0.05 to 0.5% by weight.

Support

Examples of a support used in the present invention include dimensionally stable plate-like substances such as paper, paper laminated with plastic (such as polyethylene, polypropylene, and polystyrene), metal plates (such as aluminum, zinc, and copper) plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-mentioned metals.

A polyester film or an aluminum plate is preferable as a support in the present invention. In particular, an aluminum plate is preferable since it has good dimensional stability and can be provided at a relatively low cost. Examples of preferable aluminum plates include pure aluminum plates and alloy plates comprising aluminum as the main component and trace quantities of a different element. Furthermore, plastic films to which aluminum is laminated or deposited can also be used. Examples of different elements included in an aluminum alloy include silicon, iron, manganese, copper, magnesium, chrome, zinc, bismuth, nickel, and titanium. A total amount of the different elements in the alloy is preferably 10% by weight or less. In the present invention, pure aluminum is particularly preferable. However, since production of a completely pure aluminum is difficult in terms of refining technology, one containing trace quantities of a different element can be used. The composition of an aluminum plate applied in the present invention as mentioned above is not specifically defined, and a known aluminum plate can be also used. The thickness of an aluminum plate used in the present invention is about 0.1 mm to 0.6 mm, preferably 0.15 mm to 0.4 mm, and more preferably 0.2 mm to 0.3 mm.

In a case in which an aluminum plate is used as the support, in order to improve the adherence of the support and a layer formed thereon, it is preferable to roughen the aluminum plate surface. Prior to roughening of the aluminum plate, a degreasing treatment with a surfactant, an organic solvent, or an aqueous alkaline solution is conducted for removing the rolling oil on the surface as needed.

The surface roughening treatment of an aluminum plate can be implemented using various methods, such as a mechanically roughening method, an electrochemically roughening method in which a plate surface is dissolved, and a chemically roughening method in which a plate surface is dissolved selectively. As a mechanical method, known methods such as a ball abrasion method, brush abrasion method, blast abrasion method, and buff abrasion method can be used. As an electrochemically roughening method, a method in which an alternating current or direct current is applied to a plate in an electrolytic solution containing a hydrochloric acid or nitric acid can be used. Further, a method combining both of the above-mentioned methods as disclosed in Japanese Patent Application Laid-Open (JP-A) No. 54-63902 can be used.

An aluminum plate to which surface roughening treatment is applied may be subjected to an alkaline etching treatment or a neutralizing treatment, if necessary, followed by an anodizing treatment so as to improve the water retention property and the abrasion resistance property of the surface, if desired. As an electrolyte used in the anodizing treatment of an aluminum plate, various electrolytes which form a porous oxide film can be used. In general, sulfuric acid, phosphoric acid, oxalic acid, chromic acid, or a mixture thereof can be used. The concentration of an electrolyte is suitaly decided according to the type of electrolyte.

Conditions of anodizing are determined according to the type of electrolyte to be used, and thus cannot be specified as a whole. However, in general, conditions of an electrolyte solution concentration of 1 to 80% by weight, a solution temperature of 5 to 70° C., a current density of 5 to 60 A/dm$^2$, a voltage of 1 to 100 V, and an electrolysis duration of 10 seconds to 5 minutes are appropriate.

An amount of anodized film less than 1.0 g/m$^2$ causes insufficient plate wear, and scratches are easily produced in a nonimage portion of the planographic printing plate and, thereby, so-called "tinting" which occurs by inking the scratches is easily produced.

After the anodizing treatment, hydrophilic treatment is applied to the aluminum surface, if necessary. Examples of a hydrophilic treatment used in the present invention include an alkaline metal silicate (such as an aqueous solution of sodium silicate) method as disclosed in U.S. Pat. Nos. 2,714,066, 3,181,461, 3,280,734, and 3,902,734. In this method, the support is treated by immersing or electrolysis with an aqueous solution of sodium silicate. Other examples include a method of treating with potassium fluorozirconate disclosed in Japanese Patent Application Publication (JP-B) No.36-22063 and a method of treating with polyvinyl phosphonate disclosed in U.S. Pat. Nos. 3,276,868, No. 4,153,461, and 4,689,272.

Others

An image recording material of the present invention can comprise a primer layer on the support, if necessary.

Various organic compounds can be used as a primer layer component. Examples include carboxy methyl cellulose; dextrin; gum arabic; organic phosphonic acids which may be substituted, such as phosphoric acids having an amino group (for example, 2-amino ethyl phosphonic acid), phenyl phosphonic acid, naphthyl phosphonic acid, alkyl phosphonic acid, glycero phosphonic acid, methylene diphosphonic acid, and ethylene diphosphonic acid; organic phosphoric acids which may be substituted, such as phenyl phosphoric acid, naphthyl phosphoric acid, alkyl phosphoric acid, and glycero phosphoric acid; organic phosphinic acids which may be substituted, such as phenyl phosphinic acid, naphthyl phosphinic acid, alkyl phosphinic acid, and glycero phosphinic acid; amino acids such as glycine and β-alanine; and hydrochlorides of amine having a hydroxy group, such as hydrochloride of triethanol amine. A primer layer component can be selected therefrom, and can be used in a combination of two or more.

An appropriate amount of an organic primer layer is 2 to 200 mg/m$^2$.

As heretofore mentioned, a planographic printing plate using an image recording material of the present invention can be produced. The planographic printing plate is preferably exposed imagewise to an infrared ray having a wavelength of 760 nm to 1,200 nm emitted from a solid-state laser or a semiconductor laser. In the present invention, the printing plate can be developed immediately after the laser irradiation, but is preferably treated with heat between the laser irradiation process and the developing process. Preferable temperature and time of a heat treatment are a range of 80° C. to 150° C. and a duration of 10 seconds to 5 minutes, respectively. As a heating method, various conventionally known methods, such as a method of heating with a panel heater or a ceramic heater, and a method of heating with a lamp can be used. Specifically, the methods disclosed in Japanese Patent Application No. 8-94197 can be used. The laser energy necessary for recording due to laser irradiation can be reduced by the heat treatment.

Subsequently, the image recording material of the present invention is preferably developed by an aqueous alkaline solution.

When an aqueous alkaline solution is used for development, a conventionally known aqueous alkaline solution can be used as a developer or a replenisher for an image recording material of the present invention. Examples include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Furthermore, also used are organic alkaline agents such as monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine, and pyridine.

These alkaline agents can be used alone or in a combination of two or more.

Particularly preferable developers among these alkaline agents are an aqueous solution of silicate, such as sodium silicate, and potassium silicate. These are preferable because the developing property can be adjusted by the ratio and concentration of silicon dioxide $SiO_2$ which is a component of silicate and an alkaline metal oxide $M_2O$. For example, alkaline metal silicates disclosed in Japanese Patent Application Laid-Open (JP-A) No. 54-62004 and Japanese Patent Application Publication (JP-B) No. 57-7427 can be used effectively.

Furthermore, it is known that, in a case in which an automatic developing machine is used for developing, by adding to the developer an aqueous solution (replenisher) whose alkaline is stronger than that of the developer, a large amount of planographic printing plates can be developed without changing the developer in the developing tank for a long time. The replenishing method is also preferably applied in the present invention.

Various types of surfactants and organic solvents can be added to a developer or a replenisher for promoting or curbing the developing property, improving the dispersion of developing scum or comformity of the printing plate image portion to ink as needed. Examples of preferable surfactants include anionic surfactants, cationic surfactants, nonionic surfactants, and ampholytic surfactants. Examples of preferable organic solvents include benzyl alcohol. It is also preferable to add polyethylene glycol or a derivative thereof, or polypropylene glycol or a derivative thereof.

Furthermore, reducing agents such as a sodium salt or a potassium salt of hydroquinone, resorcin, an inorganic acid including sulfurous acid and hydrogen sulfurous acid, organic carboxylic acid, antifoaming agents, and water softeners can be added to a developer or a replenisher as needed.

Examples of developers containing a surfactant, an organic solvent and a reducing agent include a developer composition comprising benzyl alcohol, an anionic surfactant, an alkaline agent and water, as disclosed in Japanese Patent Application Laid-Open (JP-A) No. 51-77401, a developer composition comprising benzyl alcohol, an anionic surfactant, and an aqueous solution including a water soluble sulfite, as disclosed in Japanese Patent Application Laid-Open (JP-A) No. 53-44202, and a developer composition comprising an organic solvent having a solubility in water at room temperature of 10% by weight or less, an alkaline agent and water, as disclosed in Japanese Patent Application Laid-Open (JP-A) No. 55-155355. These developers are preferably used in the present invention.

Printing plates developed with the above-mentioned developers and replenishers are subjected to a posttreatment with a rinsing solution containing water, a surfactant, etc., and a desensitizing solution containing gum arabic, a starch derivative, etc. As a posttreatment employed in a case in which an image recording material of the present invention is used as the printing plate, these treatments can be used in combination.

Recently, an automatic developing machine has been widely used in plate making and printing industries in order to streamline and standardize the plate making operation. In general, this automatic developing machine comprises a developing part and a posttreatment part, and each part comprises a device for conveying a printing plate, treatment tanks, and spraying devices, wherein the developing processing is carried out by spraying a treatment, which is pumped up by a pump, from a spray nozzle to the printing plate after exposure, while the printing plate is being conveyed horizontally. In addition, a processing method has also become known recently in which an exposed printing plate is immersed in a treatment tank filled with the treatment while the printing plate is being conveyed by guide rolls. In such automatic processing, a replenisher can be replenished for each treatment depending upon the amount of printing plate to be developed, work time, and the like.

The so-called disposable method, wherein a substantially unused treating solution is utilized for treatment, can be applied as well.

A planographic printing plate obtained as mentioned above can be provided for a printing process, after applying a desensitizing gum, if desired. However, in a case in which a planographic printing plate having higher plate wear is desired, a burning treatment is applied to it.

In a case in which a burning treatment is applied to a planographic printing plate, it is preferable to treat the plate with a counteretching solution, as disclosed in Japanese Patent Application Publication (JP-B) Nos. 61-2518 and 55-28062, and Japanese Patent Application Laid-Open (JP-A) Nos. 62-31859, and 61-159655, before burning.

Methods thereof include a method of applying the counteretching solution on a planographic printing plate with a sponge or an absorbent cotton impregnated with them, a method of applying the counteretching solution to a printing plate by immersion the plate in a tray filled with the solution, and a method of applying the solution to the plate by an automatic coater. By equalizing an amount of the solution with a squeegee or a squeegee roller after the application, a further preferable result can be obtained.

An appropriate amount of a counteretching solution to be applied is of 0.03 to 0.8 $g/m^2$ (dry weight), in general.

A planographic printing plate to which the counteretching solution is applied and which is dried is heated at a high temperature with a burning processor (such as a burning processor BP-1300 commercially available from Fuji Photo Film Co., Ltd.) as needed. The heating temperature and the duration depend on the type of components forming the image. However, a range of 180 to 300° C. and a range of 1 to 20 minutes are preferable.

A planographic printing plate treated with the burning treatment can be subjected to conventional treatments such as washing with water and gum coating as needed. However, in a case in which a counteretching solution containing a water-soluble polymer compound is used, a desensitizing treatment such as gum coating can be omitted.

A planographic printing plate obtained by such treatment is used in an offset printer for printing large quantities.

EXAMPLES

The present invention shall now be explained in detail by way of examples. However the present invention is not limited by these examples.

Synthesis of Polymer [BP-1]

24.83 g (0.2 mole) of o-methoxyphenol and 100 ml of tetrahydrofuran were placed in a 500 ml-flask equipped with a stirring device and a cooling pipe. A solution in which sodium methoxide (0.2 mole) was dissolved in methanol was added to the flask while stirring the contents. Then tetrahydrofuran and methanol were eliminated at reduced pressure. 300 ml of tetrahydrofuran was added to the flask and then 46.94 g (0.2 mole) of 2-chloroethyl-p-toluene sulfonate was added thereto. The mixture was then stirred under heating reflux for 20 hours to promote reaction. After reaction, insoluble matters were eliminated by filtration, and the product was condensed at reduced pressure. The reaction mixture was then refined by column chromatography using silica gel, and 25.1 g of 2-(o-methoxyphenoxy)ethyl chloride was produced.

Then 25.1 g of 2-(o-methoxyphenoxy) ethyl chloride, 33.40 g of potassium methacrylate, 11.17 g of potassium iodide, 50 ml of N,N-dimethylformamide, and a small amount of hydroquinone were placed in a 200 ml-flask equipped with a stirring device and a cooling pipe. The mixture was heated at 100° C. and stirred. The reacted mixture was refined by column chromatography using silica gel, and 24.8 g of 2-(o-methoxyphenoxy)ethyl methacrylate was produced.

21.4 g of 1-methoxy-2-propanol was placed in a 100 ml-flask equipped with a stirring device and a cooling pipe and heated at 75° C. under nitrogen air flow. While stirring the contents of the flask, a mixture of 15.36 g of 2-(o-methoxyphenoxy)ethyl methacrylate, 3.01 g of methacrylic acid, 0.1151 g of "V-601" (azo type polymerization initiator manufactured by Wako Pure Chemical Ind., Ltd.), and 21.4 g of 1-methoxy-2-propanol was added dropwise to the flask over 2.5 hours. After the addition of them, 0.1151 g of "V-601" was added and the mixture was stirred at 75° C. for 3hours. After reaction, the mixture was cooled to room temperature and 50 ml of methanol was added thereto. The mixture was added to 1 liter of water while stirring. The precipitated product was collected by filtration and dried at reduced pressure. 17.5 g of Polymer [BP-1] was produced. The weight-average molecular weight measured by GPC was 62,000 (polystyrene standard).

Synthesis of Polymer [BP-2]

2,6-dimethoxyphenol and 3-chloropropanol were reacted under basic conditions to obtain 3-(2,6-dimethoxyphenyl) propanol. Methyl acrylate and 3-(2,6-dimethoxyphenyl) propanol were reacted in the presence of an acid catalyst while eliminating methanol by heating to perform transesterification and 3-(2,6-dimethoxyphenyl)propyl acrylate was produced. 3-(2,6-dimethoxyphenyl)propyl acrylate, N-(p-sulfamoylphenyl)methacrylamide and acrylic acid were copolymerized to obtain Polymer [BP-2]. The weight-average molecular weight measured by GPC was 66,000 (polystyrene standard).

Synthesis of Polymers [BP-3] to [BP-10]

Polymers [BP-3] to [BP-10] shown in Tables 1 to 4 were synthesized using the above process.

TABLE 1
| Polymer | Structural formula (composition molar ratio, Mw) |
| --- | --- |
| [BP-1] | 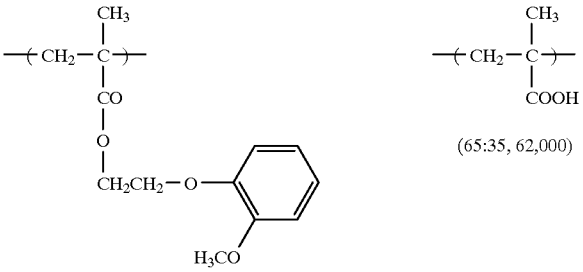 |
| [BP-2] | 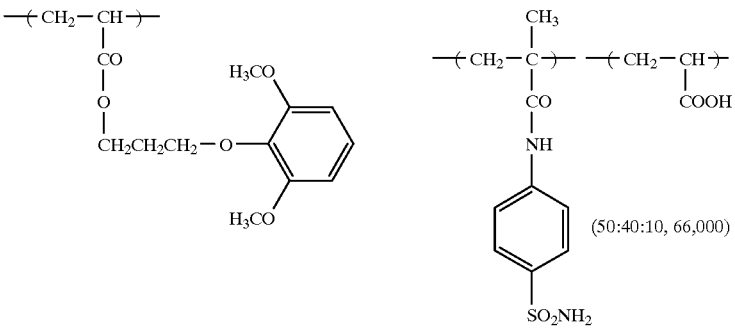 |
| [BP-3] | 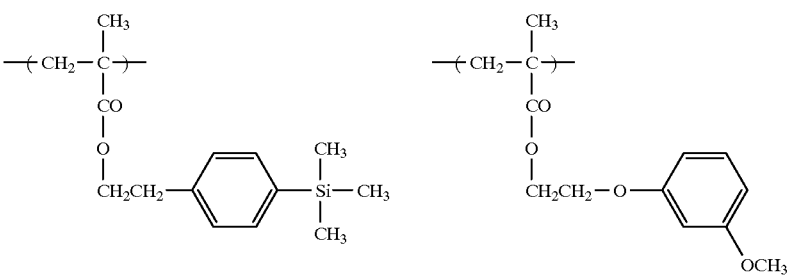 |

TABLE 2
| Polymer | Structural formula (composition molar ratio, Mw) |
|---|---|
| [BP-4] | 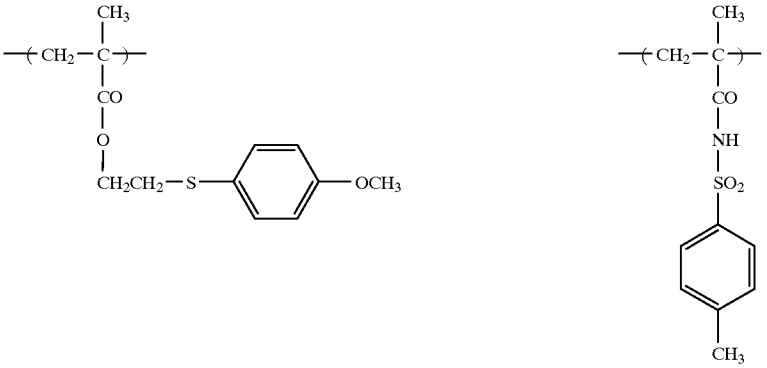 (60:40, 58,000) |
| [BP-5] (mixture of m-structure and p-structure) | 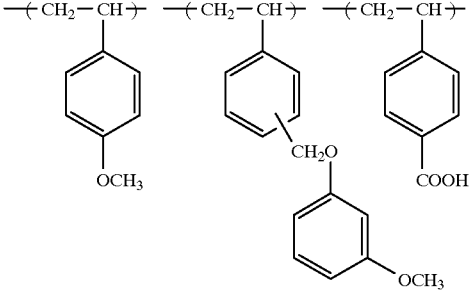 (40:30:30, 77,000) |
| [BP-6] | 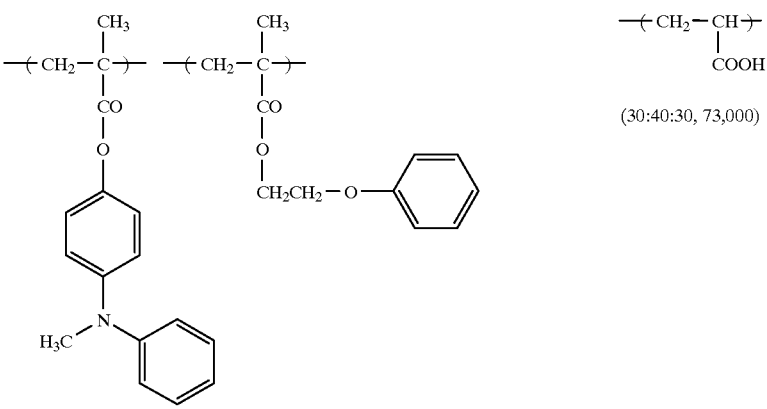 (30:40:30, 73,000) |

TABLE 3

| Polymer | Structural formula (composition molar ratio, Mw) |
|---|---|

[BP-7]

―(CH₂―C(CH₃)―)― with CO―O―CH₂CH₂―OCO―(2,4-dimethoxyphenyl with H₃CO and OCH₃)

―(CH₂―C(CH₃)―)― with CO―NH―(phenyl)―OH

―(CH₂―C(CH₃)―)― with COOCH₂CH₃

(40:40:20, 69,000)

[BP-8]

―(CH₂―C(CH₃)―)― with CO―NH―(phenyl)―OCH₃ (meta)

―(CH₂―C(CH₃)―)― with CO―NH―CH₂CH₂―(phenyl with OCH₃, OCH₃)

―(CH₂―CH―)― with COOH (40:35:25, 55,000)

TABLE 4

| Polymer | Structural formula (composition molar ratio, Mw) |
|---|---|

[BP-9]

―(CH₂―C(CH₃)―)― with CO―O―CH₂CH₂―N(CH₂CH₃)(phenyl)

―(CH₂―C(CH₃)―)― with CO―O―CH₂CH₂―O―(phenyl with H₃CO)

TABLE 4-continued

| Polymer | Structural formula (composition molar ratio, Mw) |
|---|---|
| 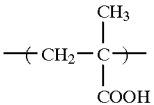 | (25:45:30, 41,000) |
| (65:35, 62,000) | |
| [BP-10] | |
| 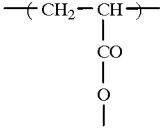 | (70:30, 48,000) |

Synthesis of Cross-linking Agent [HM-1]

20 g of 1-[α-methyl-α-(4-hydroxyphenyl)ethyl]-4-[α,α-bis(4-hydroxyphenyl)ethyl]benzene ("Trisp-PA", manufactured by Honshu Chemical Industry, Co., Ltd.) was added to a 10% aqueous solution of potassium hydroxide, stirred and dissolved. 60 ml of a 37% aqueous solution of formalin was gradually added over 1 hour to the mixture while stirring. The resultant mixture was stirred at room temperature for 6 hours and added to a dilute sulfuric acid. The precipitated product was filtrated and well rinsed with water. Then by recrystallization with 30 ml of methanol, 20 g of a white solid phenol derivative having a hydroxymethyl group of the following structure [HM-1] was obtained. The purity was 92% (liquid chromatography method).

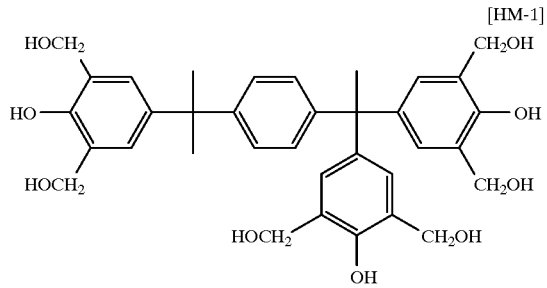

[HM-1]

Synthesis of Cross-linking Agent [MM-1]

20 g of the phenol derivative having a hydroxymethyl group [HM-1] obtained in the above synthesis example was added to 1 liter of methanol, heated, stirred and dissolved. After adding 1 ml of concentrated sulfuric acid, the solution was heat refluxed for 12 hours. After the reaction, the reacted solution was cooled off, and 2 g of potassium carbonate was added thereto. After sufficiently condensing the mixture, 300 ml of ethyl acetate was added. The resultant solution was washed with water, condensed and evaporated to dryness to give 22 g of a white solid phenol derivative having a methoxymethyl group of the following structure [MM-1]. The purity was 90% (liquid chromatography method).

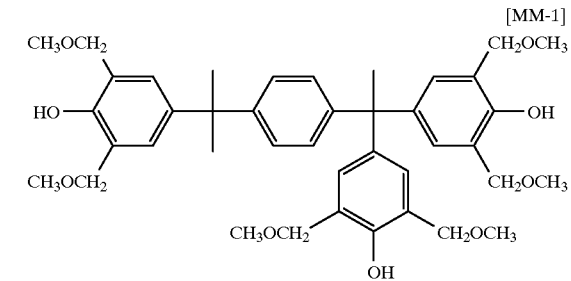

[MM-1]

EXAMPLE 1

An aluminum plate (material 1050) 0.30 mm thick was degreased by washing with trichloroethylene. The aluminum plate surface was then roughened with a nylon brush and a suspension in which a 400-mesh powder of pumice stone is suspended in water, then washed thoroughly with water. The plate was etched by soaking in a 25% aqueous solution of sodium hydroxide at 45° C. for 9 seconds and rinsing with water. The plate was then soaked in a solution of 2% $HNO_3$ for 20 seconds and washed with water. The etching amount of the grained surface was about 3 g/m². Then the plate was provided with a direct current anodic oxidization film of 3 g/m² with a solution of 7% $H_2SO_4$ as the electrolyte and a current density of 15 A/dm², and rinsed with water and dried. The aluminum plate was treated with the following primer solution and the prime layer was dried at 80° C. for 30 seconds. The coating amount after drying was 10 mg/m².

Primer solution

| β-alanine | 0.1 g |
|---|---|
| Phenyl phosphonic acid | 0.05 g |
| Methanol | 40 g |
| Pure water | 60 g |

The following solution [P] was prepared, applied to the above primer-coated aluminum plate and dried at 100° C. for 1 minute. A negative type planographic printing plate [P-1] was obtained. The amount of dried coating was 1.5 g/m$^2$.

| Solution [P] | |
| --- | --- |
| Polymer [BP-1] | 1.5 g |
| Heat cross-linking agent [MM-1] | 0.5 g |
| Acid generating agent (VI-1) | 0.15 g |
| A dye obtained by having 1-naphthalene-sulfonic acid as the counter ion of victoria pure blue BOH | 0.05 g |
| "Megafak F-177" (Fluorine-containing surfactant, manufactured by Dainippon Ink & Chemicals, Inc.) | 0.06 g |
| Methyl ethyl ketone | 15 g |
| 1-methoxy-2-propanol | 5 g |
| Methyl alcohol | 7 g |

The negative type planographic printing plate [P-1] produced, was exposed to ultraviolet light. Upon exposure, the plate was heat treated with a panel heater at 100° C. for 30 seconds, then processed in an automatic developing machine with the developer DP-4 (1:8) and the rinsing solution FR-3 (1:7) which were manufactured by Fuji Photo Film Co., Ltd. The surface was treated with the gum GU-7 (1:1) manufactured by Fuji Photo Film Co., Ltd. and provided for printing with the Heidel KOR-D machine. A preferable copy free of stains in the non-image portion was obtained.

EXAMPLES 2 TO 10

In the following solution [Q], nine kinds of solutions [Q-2] to[Q-9] were prepared using different kinds of compounds. The solutions were applied to aluminum plates primer-coated in the manner of Example 1 and dried at 100° C. for 1 minute. The negative type planographic printing plates [Q-2] to [Q-9] were produced. The amount of dried coating was 1.5 g/m$^2$.

| Solution [Q] | |
| --- | --- |
| Polymer | 1.5 g |
| Heat cross-linking agent | 0.5 g |
| Acid generating agent | 0.2 g |
| Infrared ray absorbing agent (product name: "NK-2014", manufactured by Nippon Kankoshikiso Kenkyujo, Co., Ltd.) | 0.15 g |
| A dye obtained by having 1-naphthalene-sulfonic acid as the counter ion of victoria pure blue BOH | 0.05 g |
| "Megafak F-177" (Fluorine-containing surfactant, manufactured by Dainippon Ink & Chemicals, Inc.) | 0.06 g |
| Methyl ethyl ketone | 15 g |
| 1-methoxy-2-propanol | 5 g |
| Methyl alcohol | 7 g |

Compounds used in the solutions [Q-2] to [Q-9] are shown in Table 5.

TABLE 5

| Example No. | Planographic printing plate | Polymer | Heat cross-linking agent | Acid generating agent |
| --- | --- | --- | --- | --- |
| 2 | [Q-1] | [BP-1] | [HM-1] | [VI-7] |
| 3 | [Q-2] | [BP-2] | [HM-1] | [VI-7] |
| 4 | [Q-3] | [BP-3] | [HM-1] | [VI-9] |
| 5 | [Q-4] | [BP-4] | [HM-1] | [VI-9] |
| 6 | [Q-5] | [BP-5] | [MM-1] | [VI-7] |
| 7 | [Q-6] | [BP-6] | [MM-1] | [VI-7] |
| 8 | [Q-7] | [BP-7] | [MM-1] | [VI-9] |
| 9 | [Q-8] | [BP-8] | [MM-1] | [VI-9] |
| 10 | [Q-9] | [BP-2] | [MM-1] | [VI-9] |

The negative type planographic printing plates [Q-2] to [Q-9] obtained were exposed to infrared light of 830–850 nm in wavelength provided by a semiconductor laser. Upon exposure, the plates were heat treated at 100° C. for 30 seconds, then processed in an automatic developing machine with the developer DP-4 (1:8) and the rinsing solution FR-3 (1:7) which were manufactured by Fuji Photo Film Co., Ltd. The surface was treated with the gum GU-7 (1:1) manufactured by Fuji Photo Film Co., Ltd. and provided for printing with the Heidel KOR-D machine. The number of preferable copies obtained at the time of printing was noted. The results are shown in Table 6. In all cases more than 40,000 copies were obtained free of stains in the non-image portions.

COMPARATIVE EXAMPLE 1

Under conditions identical to those of Example 2 except that novolak resin (Mw: 2,500), obtained by the reaction of m-cresol and formaldehyde under acidic conditions, was used in place of the polymer [BP-1] in the solution [Q-1] used in Example 2, a negative type planographic printing plate [R] was produced. The negative type planographic printing plate [R] obtained was provided with images and treated to printing as in the manner of Example 2. The number of preferable copies obtained was noted. The results are shown in Table 6. only about 20,000 copies were obtained. Further, slight staining was observed in the non-image portions.

TABLE 6

| Example | Planographic printing plate | Number of printing |
| --- | --- | --- |
| 2 | [Q-1] | 46,000 |
| 3 | [Q-2] | 43,000 |
| 4 | [Q-3] | 41,000 |
| 5 | [Q-4] | 43,000 |
| 6 | [Q-5] | 44,000 |
| 7 | [Q-6] | 45,000 |
| 8 | [Q-7] | 40,000 |
| 9 | [Q-8] | 48,000 |
| 10 | [Q-9] | 42,000 |
| Comp. Ex. 1 | [R] | 21,000 |

From the results of Examples 2 to 10 and Comparative Example 1, it was observed that the planographic printing plates using the negative type image recording material of the present invention are excellent in terms of printing durability at the time of printing and also in terms of stain-resistance in the non-image portions.

EXAMPLES 11 TO 15

An aluminum plate (material 1050) 0.30 mm thick was degreased by washing with trichloroethylene. The aluminum plate surface was then roughened with a nylon brush and a suspension in which a 400-mesh powder of pumice stone is suspended in water, then washed thoroughly with water. The plate was etched by soaking in a 25% aqueous solution of sodium hydroxide at 45° C. for 9 seconds and rinsing with water. The plate was then soaked in a solution of 2% $HNO_3$ for 20 seconds and washed with water. The etching amount of the grained surface was about 3 $g/m^2$. Then the plate was provided with a direct current anodic oxidization film of 3 $g/m^2$ with a solution of 7% $H_2SO_4$ as the electrolyte and a current density of 15 $A/dm^2$. The aluminum plate was soaked in a 2.5% aqueous solution of sodium silicate at 70° C. for 1 minute, rinsed with water and dried.

In the following solution [S], the compound types were changed and 5 kinds of solutions [S-1] to [S-5] were prepared. The solutions were applied to the above aluminum plates and dried at 100° C. for 1 minute. Negative type planographic printing plates [S-1] to [S-5] were obtained. The amount of dried coating was 1.6 $g/m^2$.

| Solution [S] | |
| --- | --- |
| Polymer | 1.6 q |
| Heat cross-linking agent | 0.5 g |
| Acid generating agent | 0.2 g |
| Infrared ray absorbing agent (product name: "NK-3508", manufactured by Nippon Kankoshikiso Kenkyujo, Co., Ltd.) | 0.15 g |
| A dye obtained by having 1-naphthalene-sulfonic acid as the counter ion of victoria pure blue BOH | 0.05 g |
| "Megafak F-177" (Fluorine-containing surfactant, manufactured by Dainippon Ink & Chemicals, Inc.) | 0.06 g |
| Methyl ethyl ketone | 15 g |
| 1-methoxy-2-propanol | 5 g |
| Methyl alcohol | 7 g |

Compounds used in the solutions [S-1] to [S-5] are shown in Table 7.

TABLE 7

| Example | Planographic printing plate | Polymer | Heat cross-linking agent | Acid generating agent |
| --- | --- | --- | --- | --- |
| 11 | [S-1] | [BP-1] | [MM-1] | [VII-1] |
| 12 | [S-2] | [BP-2] | [MM-1] | [VII-1] |
| 13 | [S-3] | [BP-4] | [MM-1] | [VII-1] |
| 14 | [S-4] | [BP-5] | [MM-1] | [VII-1] |
| 15 | [S-5] | 0.8 g each of [BP-1] and [BP-6] | [MM-1] | [VII-1] |

The negative type planographic printing plates [S-1] to [S-5] obtained, were exposed by a YAG solid state laser generating infrared light of about 1064 nm in wavelength. After exposure, the plates were heat treated at 100° C. for 30 seconds, then developed with the developer DN-3C (1:1) manufactured by Fuji Photo Film Co., Ltd. The surface was treated with FN-2 and provided for printing with the Heidel KOR-D machine. The number of preferable copies obtained was noted. The results are shown in Table 8. In all cases more than 30,000 copies were obtained. Staining was not observed in the non-image portions of any copy.

COMPARATIVE EXAMPLE 2

Under conditions identical to those of Example 11 except that novolak resin (weight-average molecular weight of 2,500), obtained by the reaction of m-cresol and formaldehyde under acidic conditions, was used in place of the polymer [BP-1] in the solution [S-1] used in Example 11, a negative type planographic printing plate [T] was produced. The negative type planographic printing plate [T] obtained was provided with images and treated to printing in the manner of Example 11. The number of the preferable copies obtained was noted. The results are shown in Table 8. Not even as many as 20,000 copies were obtained.

TABLE 8

| Example | Planographic printing plate | Number of printing |
| --- | --- | --- |
| 11 | [S-1] | 34,000 |
| 12 | [S-2] | 32,000 |
| 13 | [S-3] | 31,000 |
| 14 | [S-4] | 31,000 |
| 15 | [S-5] | 33,000 |
| Comp. Ex. 2 | [T] | 18,000 |

From the results of Examples 11 to 15 and Comparative Example 2, it was observed that the planographic printing plates using the negative type image recording material of the present invention are excellent in terms of printing durability at the time of printing and also in terms of stain-resistance in the non-image portions.

EXAMPLES 16 TO 17

In the following solution [U], the compound types were changed and 2 kinds of solutions [U-1] to [U-2] were prepared. The solutions were applied to the above aluminium plates and dried at 100° C. for 1 minute. Negative type planographic printing plates [U-1] to [U-2] were obtained. The amount of dried coating was 1.0 $g/m^2$.

| Solution [U] | |
| --- | --- |
| Polymer | 1.2 g |
| Heat cross-linking agent | 0.4 g |
| Acid generating agent | 0.15 g |
| Infrared ray absorbing agent (product name: "NK-2014" manufactured by Nippon Kankoshikiso Kenkyujo, Co., Ltd.) | 0.12 g |
| A dye obtained by having 1-naphthalene-sulfonic acid as the counter ion of victoria pure blue BOH | 0.04 g |
| "Megafak F-177" (Fluorine-containing surfactant, manufactured by Dainippon Ink & Chemicals, Inc.) | 0.05 g |
| Methyl ethyl ketone | 5 g |
| 1-methoxy-2-propanol | 15 g |
| Methyl alcohol | 5 g |
| Water | 5 g |

Compounds used in the solutions [U-1] to [U-2] are shown in Table 9.

TABLE 9

| Example | Planographic printing plate | Polymer | Heat cross-linking agent | Acid generating agent |
|---|---|---|---|---|
| 16 | [U-1] | [BP-9] | [HM-1] | [VI-5] |
| 17 | [U-2] | [BP-10] | [HM-1] | [VI-5] |

The negative type planographic printing plates [U-1] to [U-2] obtained, were exposed by a semiconductor laser generating infrared light of about 830 to 850 nm in wavelength. After exposure, the plates were heat treated at 130° C. for 30 seconds, then developed by rubbing with a brush while rinsing with tap water. The printing plates obtained were treated to printing. Preferable copies stain-free in the non-image portions were obtained.

What is claimed is:

1. A negative type image recording material comprising (A) a polymer including the structure represented by the following general formula (I) in the polymer side chain, (B) a compound which cross-links in the presence of acid, (C) a compound which generates an acid in the presence of light or heat:

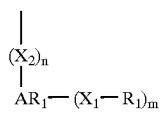
(I)

wherein, $Ar_1$ represents an arylene group having 20 or less carbon atoms which may be substituted; $X_1$ represents $NR_2$, O, S or $SiR_3R_4$; $X_2$ represents $NR_5$, O, S or $SiR_6R_7$; $R_1$ represents a hydrocarbon group having 20 or less carbon atoms which may be substituted; $R_2$, $R_3$, $R_4$, $R_5$, $R_6$ and $R_7$ may be the same or different, and each represents a hydrogen atom or a hydrocarbon having 20 or less carbon atoms which may be substituted; m represents an integer from 0 to 5; and n represents 1 when m is 0, and 0 or 1 when m is from 1 to 5 and (D) an infrared absorbing agent wherein the negative type image recording material is recordable by an infrared laser.

2. The negative type image recording material according to claim 1, wherein said polymer contains the structure represented by the following general formula (II) or (III):

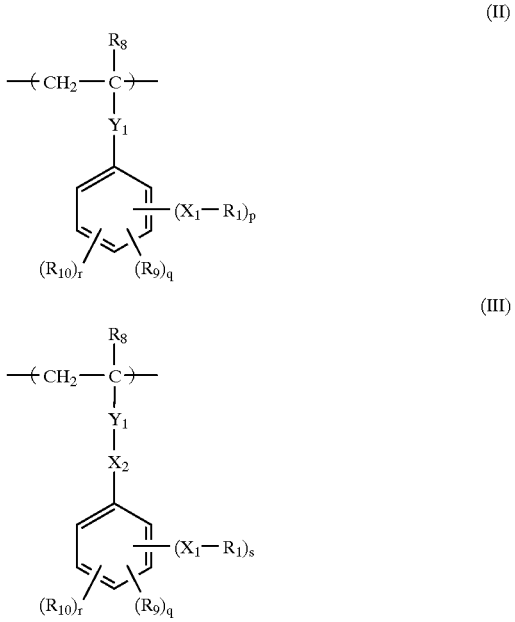

wherein $Y_1$ represents a single bond, an ester bond, an amide bond, an ether bond, or a hydrocarbon group having 20 or less carbon atoms which may have the above-mentioned bonds; $R_8$ represents a hydrogen atom or a methyl group; $R_9$ and $R_{10}$ may be the same or different, and each represents a hydrogen atom, a halogen atom, or a hydrocarbon group having 20 or less carbon atoms which may be substituted; p represents an integer from 1 to 4; q and r both represent an integer from 0 to 3; s represents an integer from 0 to 4; $X_1$ and $R_1$ are the same as $X_1$ and $R_1$ respectively from the general formula (I).

3. The negative type image recording material according to claim 1, wherein said polymer is at least one selected from the group consisting of the polymers represented by the following structural formulas:

| Polymer | Structural formula (composition molar ratio, Mw) |
|---|---|
| [BP-1] |  (65:35, 62,000) |

-continued
| Polymer | Structural formula (composition molar ratio, Mw) |
|---|---|
[BP-2]
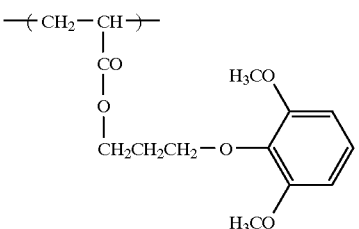
(50:40:10, 66,000)
[BP-3]
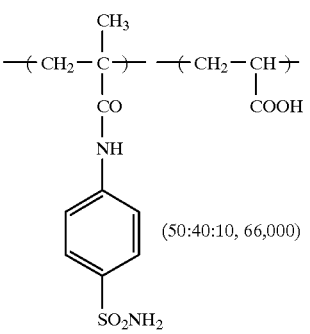
(30:30:40, 53,000)
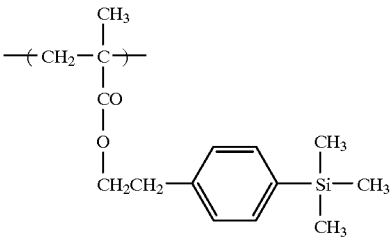
(65:35, 62,000)
[BP-4]
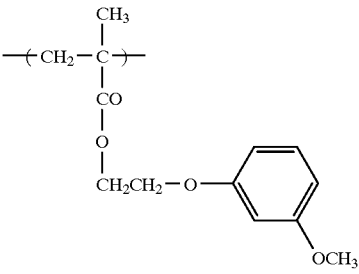
(60:40, 58,000)

-continued
| Polymer | Structural formula (composition molar ratio, Mw) |
|---|---|
[BP-5]
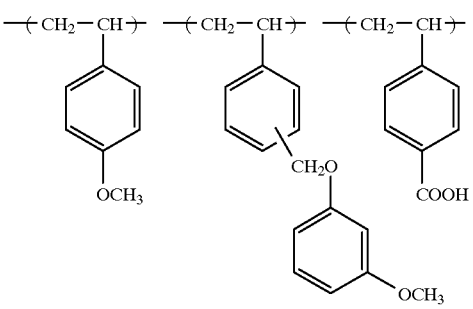
(40:30:30, 77,000)
(mixture of m-structure and p-structure)
[BP-6]
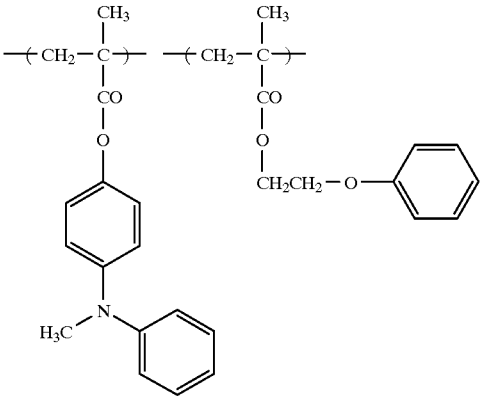
(30:40:30, 73,000)
[BP-7]
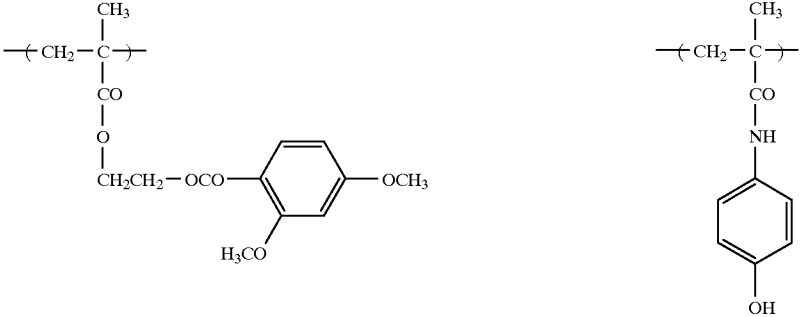
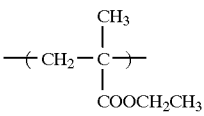
(40:40:20, 69,000)

| Polymer | Structural formula (composition molar ratio, Mw) |
|---|---|
| [BP-8] | 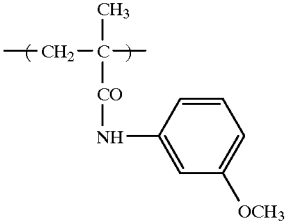 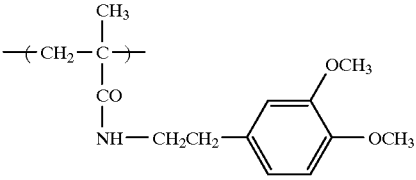<br>(40:35:25, 55,000) |
| [BP-9] | 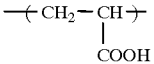 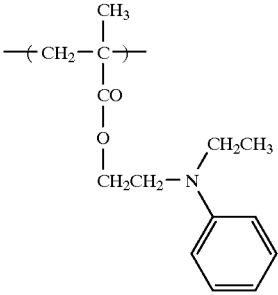<br>(25:45:30, 41,000)<br>(65:35, 62,000) |
| [BP-10] | 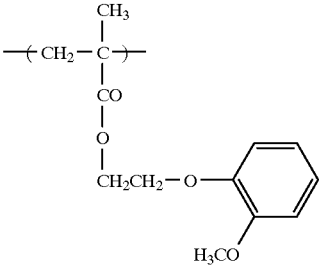 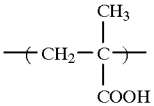<br>(70:30, 48,000) |

4. The negative type image recording material according to claim 1, wherein the content of said polymer containing the polymer represented by the general formula (I) is from 20 to 95% by weight.

5. The negative type image recording material according to claim 1, wherein the compound which cross-links in the presence of acid has at least two hydroxymethyl groups, alkoxymethyl groups, epoxy groups or vinyl ether groups within the molecule.

6. The negative type image recording material according to claim 5, wherein the compound which cross-links in the presence of acid is selected from at least one of the compounds represented by the following structural formulas:

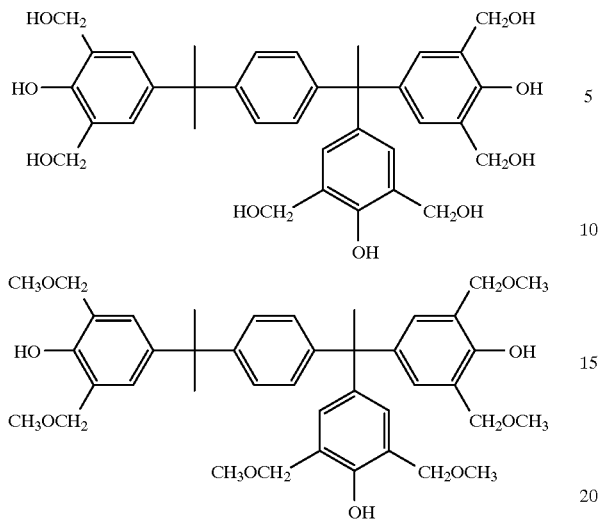

7. The negative type image recording material according to claim 1, wherein the content of the compound which cross-links in the presence of acid is from 5 to 70% by weight.

8. The negative type image recording material according to claim 1, wherein the compound generating an acid in the presence of light or heat is represented by the following general formula (VI) or (VII):

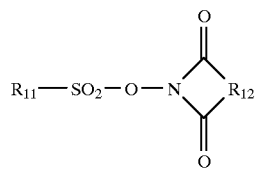

(VI)

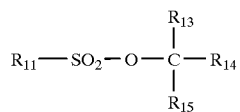

(VII)

wherein $R_{11}$ represents a hydrocarbon group having 30 or less carbon atoms which may be substituted; $R_{12}$ represents a divalent hydrocarbon group having 25 or less carbon atoms which may be substituted; $R_{13}$, $R_{14}$, and $R_{15}$ may be the same or different, and each represents a hydrogen atom or a hydrocarbon group having 20 or less carbon atoms which may be substituted, and furthermore, two or more of $R_{13}$, $R_{14}$, and $R_{15}$ may be bonded to each other to form a ring.

9. The negative type image recording material according to claim 8, wherein the compound generating an acid in the presence of light or heat is selected from at least one of the compounds represented by the following structural formulas:

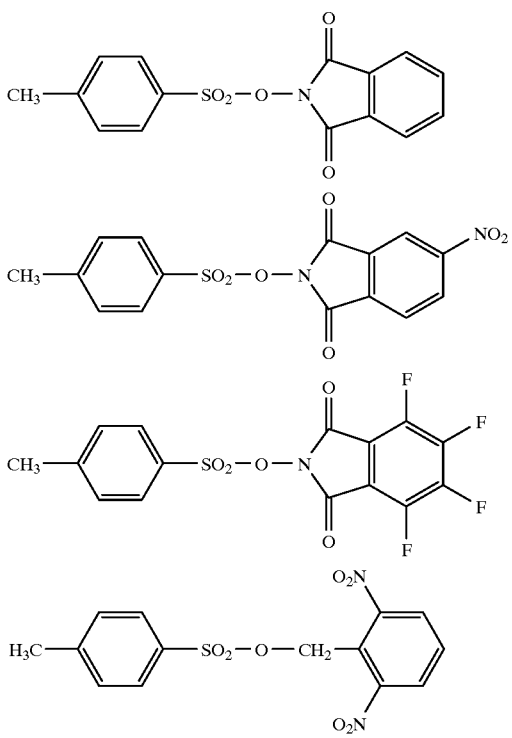

10. The negative type image recording material according to claim 1, wherein the content of the compound generating an acid in the presence of light or heat is from 0.01 to 50% by weight.

11. The negative type image recording material according to claim 1, further comprising a spectral sensitizing agent.

12. A negative type image recording material comprising (A) a polymer including the structure represented by the following general formula (I) in the polymer side chain, (B) a compound which cross-links in the presence of acid, and having at least two hydroxymethyl groups, alkoxymethyl groups, epoxy groups or vinyl ether groups within the molecule, and (C) a compound generating an acid in the presence of light or heat represented by the following general formula (VI) or (VII):

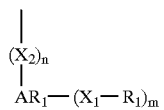

(I)

wherein, $Ar_1$ represents an arylene group having 20 or less carbon atoms which may be substituted; $X_1$ represents $NR_2$, O, S or $SiR_3R_4$; $X_2$ represents $NR_5$, O, S or $SiR_6R_7$; $R_1$ represents a hydrocarbon group having 20 or less carbon atoms which may be substituted; $R_2$, $R_3$, $R_4$, $R_5$, $R_6$ and $R_7$ may be the same or different, and each represents a hydrogen atom or a hydrocarbon atom having 20 or less carbon atoms which may be substituted; m represents an integer from 0 to 5; and n represents 1 when m is 0 and 0 or 1 when m is from 1 to 5;

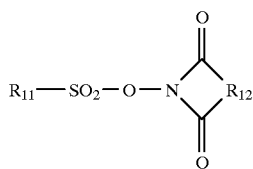
(VI)

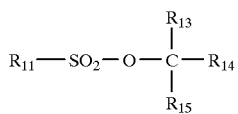
(VII)

wherein $R_{11}$ represents a hydrocarbon group having 30 or less carbon atoms which may be substituted; $R_{12}$ represents a divalent hydrocarbon group having 25 or less carbon atoms which may be substituted; $R_{13}$, $R_{14}$, and $R_{15}$ may be the same or different, and each represents a hydrogen atom or a hydrocarbon group having 20 or less carbon atoms which may be substituted; and further, two or more of $R_{13}$, $R_{14}$, and $R_{15}$ may be bonded to each other to form a ring and (D) an Infrared absorbing agent wherein the negative type Image recording material Is recordable by an Infrared laser.

13. The negative type image recording material according to claim 12, wherein said polymer contains the structure represented by the following general formula (II) or (III):

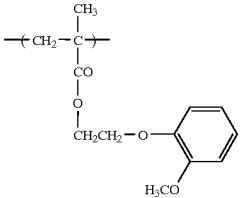
(II)

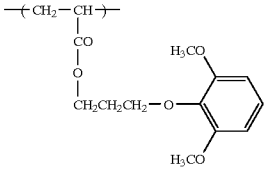
(III)

wherein $Y_1$ represents a single bond, an ester bond, an amide bond, an ether bond, and a hydrocarbon group having 20 or less carbon atoms which may have the above-mentioned bonds; $R_8$ represents a hydrogen atom or a methyl group; $R_9$ and $R_{10}$ may be the same or different, and each represents a hydrogen atom, a halogen atom, or a hydrocarbon group having 20 or less carbon atoms which may be substituted; p represents an integer from 1 to 4; q and r both represent an integer from 0 to 3; s represents an integer from 0 to 4; and $X_1$ and $R_1$ are the same as $X_1$ and $R_1$ respectively from the general formula (I).

14. The negative type image recording material according to claim 13, wherein said polymer is selected from at least one of the polymers represented by the following structural formulas:

| Polymer | Structural formula (composition molar ratio, Mw) |
|---|---|
| [BP-1] | 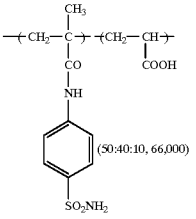 (65:35, 62,000) |
| [BP-2] | 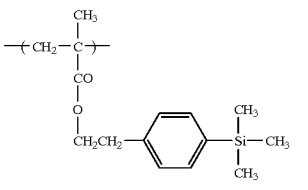 (50:40:10, 66,000) |
| [BP-3] | 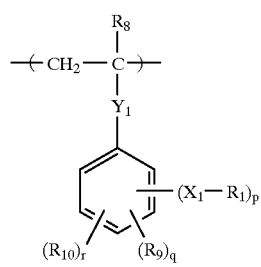 (30:30:40, 53,000) |
| [BP-4] | 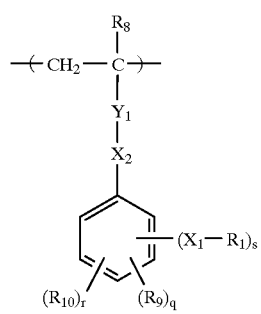 (60:40, 58,000) |

| Polymer | Structural formula (composition molar ratio, Mw) |
|---|---|
| [BP-5] | 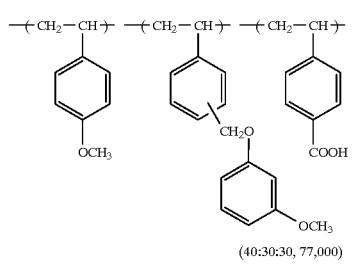 (40:30:30, 77,000) (mixture of m-structure and p-structure) |
| [BP-6] | 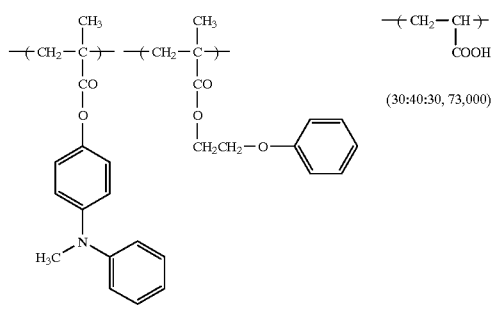 (30:40:30, 73,000) |
| [BP-7] | 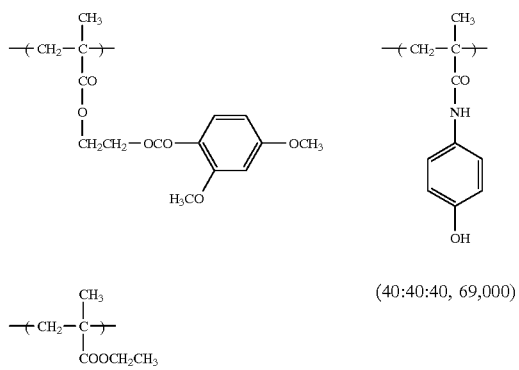 (40:40:40, 69,000) |
| [BP-8] | 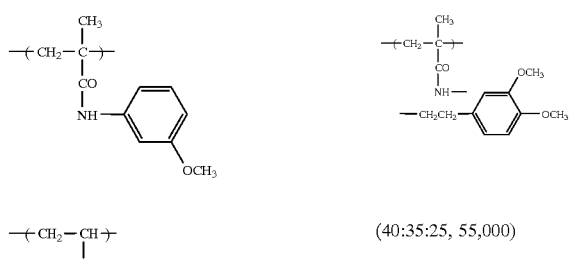 (40:35:25, 55,000) |
| [BP-9] | 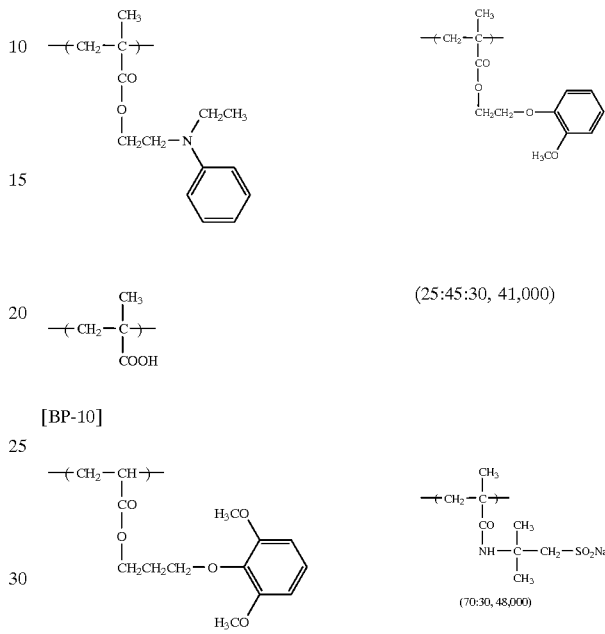 (25:45:30, 41,000) |
| [BP-10] | 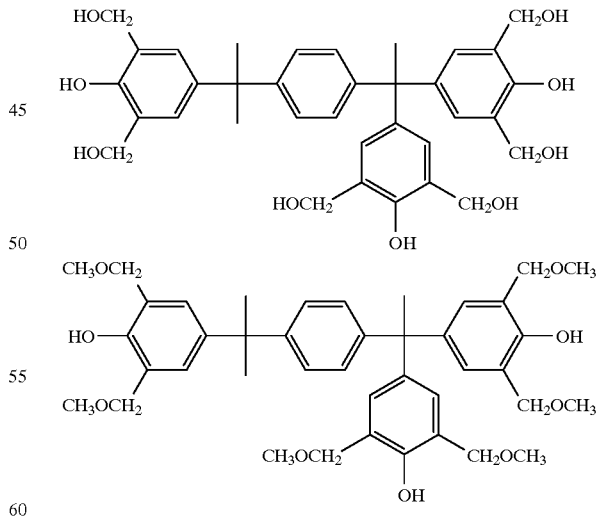 (70:30, 48,000) |

15. The negative type image recording material according to claim 12, wherein the compound which cross-links in the presence of acid is selected from at least one of the compounds represented by the following structural formulas:

16. The negative type image recording material according to claim 12, wherein the compound generating an acid in the presence of light or heat is selected from at least one of the compounds represented by the following general formulas;

17. A negative type image recording material comprising (A) at least one polymer selected from the polymers represented by the following general formulas, (B) at least one compound selected from the compounds which cross-link in the presence of acid represented by the following general formulas, and (C) at least one compound selected from the compounds generating an acid in the presence of light or heat represented by the following general formulas:

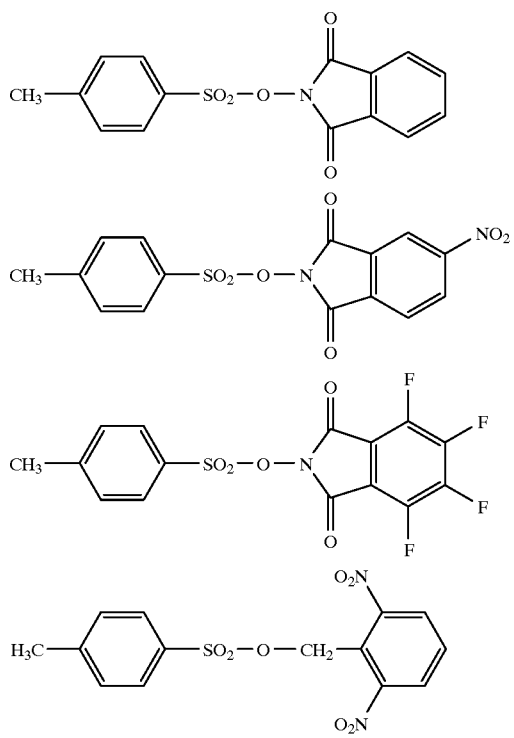

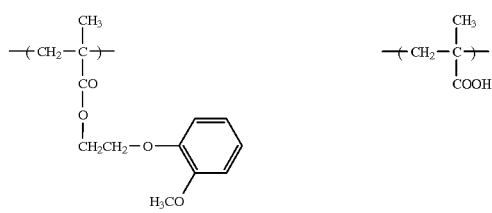

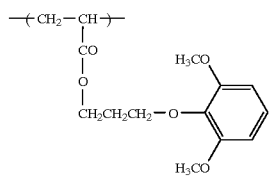

| Polymer | Structural formula (composition molar ratio, Mw) |
|---|---|
| [BP-7] | 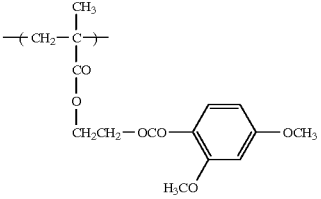 (40:40:20, 69,000) |
| [BP-8] | 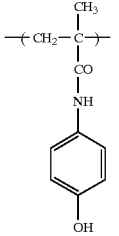 (40:35:25, 55,000) |
| [BP-9] | 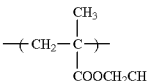 (25:45:30, 41,000) |
| [BP-10] | 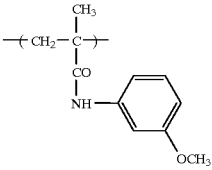 (70:30, 48,000) |
compounds which cross-link in the presence of acid
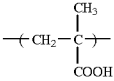
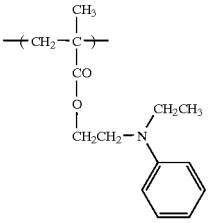
compounds which generate an acid in the presence of light or heat
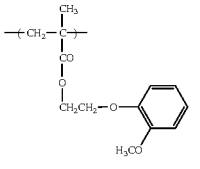
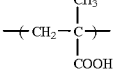
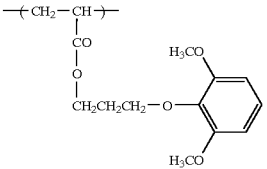
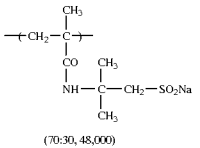
* * * * *